(12) United States Patent
Ibrahim et al.

(10) Patent No.: US 8,121,570 B2
(45) Date of Patent: Feb. 21, 2012

(54) METHOD AND SYSTEM FOR FLEXIBLE FM TUNING

(75) Inventors: Brima Ibrahim, Aliso Viejo, CA (US);
Bojko Marholev, Irvine, CA (US);
Lijun Zhang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 409 days.

(21) Appl. No.: 12/418,448

(22) Filed: Apr. 3, 2009

(65) Prior Publication Data
US 2009/0191828 A1     Jul. 30, 2009

Related U.S. Application Data

(63) Continuation of application No. 11/287,120, filed on Nov. 22, 2005, now Pat. No. 7,515,935.

(60) Provisional application No. 60/685,239, filed on May 26, 2005.

(51) Int. Cl.
*H04Q 7/20*     (2006.01)

(52) U.S. Cl. ..... 455/205; 455/206; 455/208; 455/553.1; 455/552.1; 455/41.1; 381/1; 381/2

(58) Field of Classification Search ............... 455/553.1, 455/552.1, 550.1, 73, 76, 77, 84, 88, 500.517, 455/67.11, 41.1, 41.2, 19, 20, 42, 63.1, 62, 63.3, 113, 120, 205, 206, 208; 381/1, 2
See application file for complete search history.

(56) References Cited

U.S. PATENT DOCUMENTS

| | | | |
|---|---|---|---|
| 5,450,621 | A | 9/1995 | Kianush et al. |
| 7,116,963 | B2 | 10/2006 | Suominen |

*Primary Examiner* — Keith Ferguson
(74) *Attorney, Agent, or Firm* — Thomas, Kayden, Horstemeyer & Risley, LLP

(57) ABSTRACT

A system for processing signals is disclosed and may include a single chip having an integrated Bluetooth radio and an integrated FM radio. The single chip may include at least one processor that enables selecting from a range of FM channels, a particular frequency for one of the FM channels based on an intermediate frequency (IF). The particular frequency may be selected so that it is an integer multiple of a channel spacing between neighboring allocated FM channels within the range of FM channels, and may be offset by at most one-half the channel spacing. The at least one processor may enable determining a frequency error of the selected particular frequency for the one of the FM channels. The at least one processor may also enable determining, whether the particular frequency includes an on-frequency channel based on the determined frequency error.

42 Claims, 20 Drawing Sheets

METHOD AND SYSTEM FOR FLEXIBLE FM TUNING

CROSS-REFERENCE TO RELATED APPLICATIONS/INCORPORATION BY REFERENCE

The present application is a continuation of U.S. patent application Ser. No. 11/287,120 (now U.S. Pat. No. 7,515,935) filed on Nov. 22, 2005, which makes reference to, claims priority to, and claims the benefit of U.S. Provisional Application Ser. No. 60/685,239 filed on May 26, 2005.

This application also makes reference to:
U.S. application Ser. No. 11/176,417, filed on Jul. 7, 2005;
U.S. application Ser. No. 11/286,555 filed on Nov. 22, 2005;
U.S. application Ser. No. 11/286,950 filed on Nov. 22, 2005;
U.S. application Ser. No. 11/287,075 filed on Nov. 22, 2005;
U.S. application Ser. No. 11/287,181 filed on Nov. 22, 2005;
U.S. application Ser. No. 11/286,947 filed on Nov. 22, 2005;
U.S. application Ser. No. 11/287,034 filed on Nov. 22, 2005;
U.S. application Ser. No. 11/287,044 filed on Nov. 22, 2005; and
U.S. application Ser. No. 11/286,844 filed on Nov. 22, 2005.

Each of the above stated applications is hereby incorporated herein by reference in its entirety.

FIELD OF THE INVENTION

Certain embodiments of the invention relate to Bluetooth and FM communication technologies. More specifically, certain embodiments of the invention relate to a method and system for flexible FM tuning.

BACKGROUND OF THE INVENTION

With the popularity of portable electronic devices and wireless devices that support audio applications, there is a growing need to provide a simple and complete solution for audio communications applications. For example, some users may utilize Bluetooth-enabled devices, such as headphones and/or speakers, to allow them to communicate audio data with their wireless handset while freeing to perform other activities. Other users may have portable electronic devices that may enable them to play stored audio content and/or receive audio content via broadcast communication, for example.

However, integrating multiple audio communication technologies into a single device may be costly. Combining a plurality of different communication services into a portable electronic device or a wireless device may require separate processing hardware and/or separate processing software. Moreover, coordinating the reception and/or transmission of data to and/or from the portable electronic device or a wireless device may require significant processing overhead that may impose certain operation restrictions and/or design challenges. For example, a handheld device such as a cellphone that incorporates Bluetooth and Wireless LAN may pose certain coexistence problems caused by the close proximity of the Bluetooth and WLAN transceivers. Furthermore, simultaneous use of a plurality of radios in a handheld may result in significant increases in power consumption. Power being a precious commodity in most wireless mobile devices, combining devices such as a cellular radio, a Bluetooth radio and a WLAN radio requires careful design and implementation in order to minimize battery usage. Additional overhead such as sophisticated power monitoring and power management techniques are required in order to maximize battery life.

A portable electronic device or a wireless device may be adapted to receive audio content via broadcast communication when used in different geographic locations. However, due to different frequency channel planning regulations adopted by different countries, processing of audio content received via broadcast communication is challenging. For example, the placement of the image frequency at a certain location may be optimal for one country but may not be optimal for another. In this regard, detection of the image channel is difficult when the portable electronic device or the wireless device is utilized in different countries. During signal processing, image rejection (IMR) techniques may be used to suppress the image channel. However, image rejection techniques are limited and may only provide limited scope of rejection of the image channel.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for flexible FM tuning, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for flexible FM tuning. Aspects of the method and system may comprise tuning to a particular frequency within a range of FM channels based on an IF frequency that includes an integer multiple of the channel spacing between neighboring allocated FM channels within the range of FM channels, offset by at most one-half the channel spacing. The method may further include determining whether the particular frequency comprises an on frequency channel utilizing a frequency error. The frequency error may be based on the IF frequency. In the United States for example, the range of FM channels is 88-108 MHz and the channel spacing is 100 KHz. Accordingly, the offset may be less than 50 KHz.

A local oscillator frequency may be selected for the tuning based on the frequency offset. An intermediate frequency (IF) channel may be generated utilizing the particular frequency and the selected local oscillator frequency. The generated IF channel may be between neighboring channels selected from the range of FM channels. The frequency error may be determined for the particular frequency within the range of FM channels. The frequency error for the particular frequency may be determined utilizing a DC offset at the output of the FM demodulator. Signal strength information for a plurality of image channels corresponding to a plurality of on frequency channels selected from the range of FM channels may be stored. Tuning to at least one of the plurality of on frequency channels may be based on the stored signal strength information.

Figure 1A:
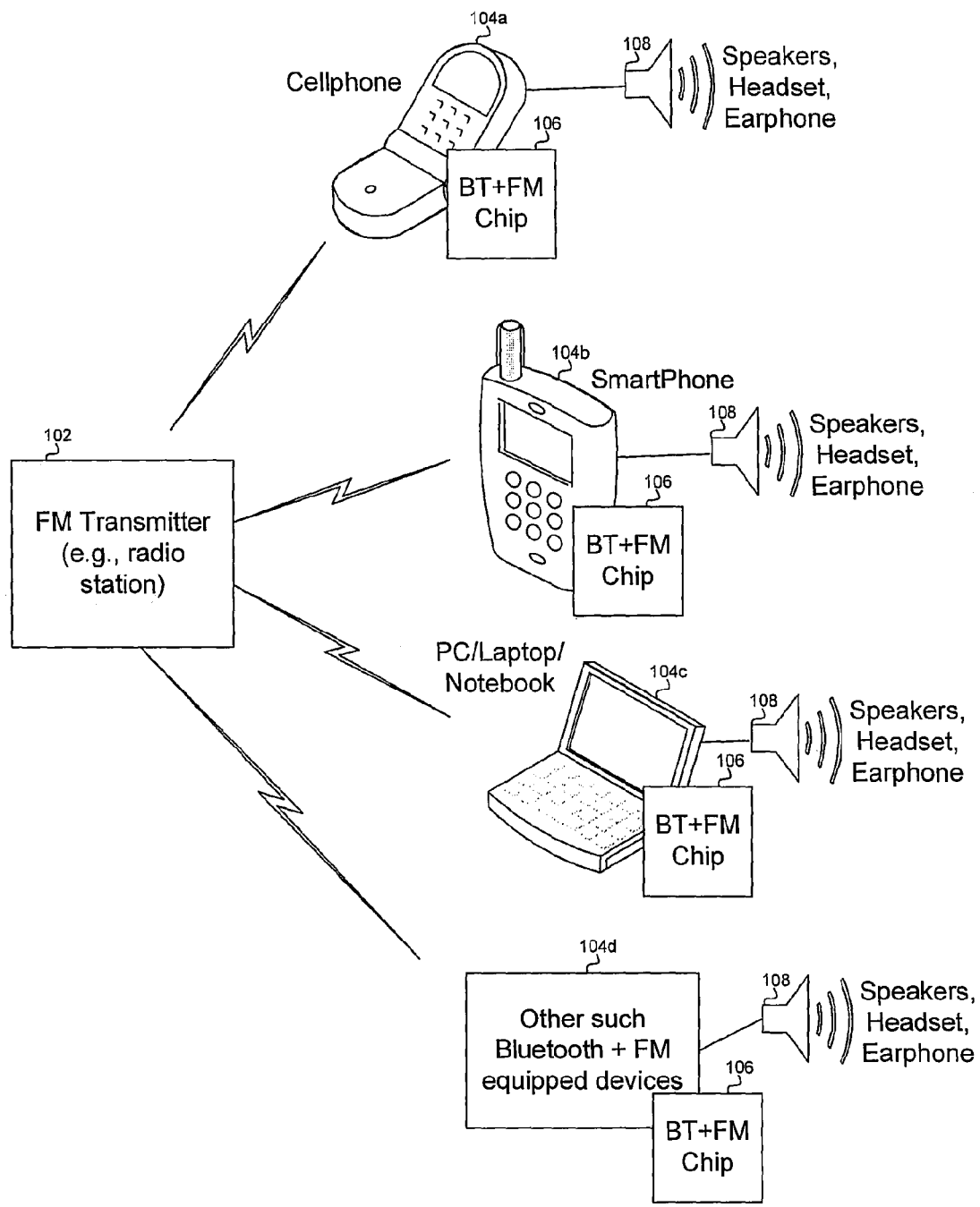
FIG. 1A is a block diagram of an exemplary FM transmitter that communicates with handheld devices that utilize a single chip with integrated Bluetooth and FM radios, in accordance with an embodiment of the invention.

FIG. 1A is a block diagram of an exemplary FM transmitter that communicates with handheld devices that utilize a single chip with integrated Bluetooth and FM radios, in accordance with an embodiment of the invention. Referring to FIG. 1A, there is shown an FM transmitter 102, a cellular phone 104*a*, a smart phone 104*b*, a computer 104*c*, and an exemplary FM and Bluetooth-equipped device 104*d*. The FM transmitter 102 may be implemented as part of a radio station or other broadcasting device, for example. Each of the cellular phone 104*a*, the smart phone 104*b*, the computer 104*c*, and the exemplary FM and Bluetooth-equipped device 104*d* may comprise a single chip 106 with integrated Bluetooth and FM radios for supporting FM and Bluetooth data communications. The FM transmitter 102 may enable communication of FM audio data to the devices shown in FIG. 1A by utilizing the single chip 106. Each of the devices in FIG. 1A may comprise and/or may be communicatively coupled to a listening device 108 such as a speaker, a headset, or an earphone, for example.

The cellular phone 104*a* may be enabled to receive an FM transmission signal from the FM transmitter 102. The user of the cellular phone 104*a* may then listen to the transmission via the listening device 108. The cellular phone 104*a* may comprise a "one-touch" programming feature that enables pulling up specifically desired broadcasts, like weather, sports, stock quotes, or news, for example. The smart phone 104*b* may be enabled to receive an FM transmission signal from the FM transmitter 102. The user of the smart phone 104*b* may then listen to the transmission via the listening device 108.

The computer 104*c* may be a desktop, laptop, notebook, tablet, and a PDA, for example. The computer 104*c* may be enabled to receive an FM transmission signal from the FM transmitter 102. The user of the computer 104*c* may then listen to the transmission via the listening device 108. The computer 104*c* may comprise software menus that configure listening options and enable quick access to favorite options, for example. In one embodiment of the invention, the computer 104*c* may utilize an atomic clock FM signal for precise timing applications, such as scientific applications, for example. While a cellular phone, a smart phone, computing devices, and other devices have been shown in FIG. 1A, the single chip 106 may be utilized in a plurality of other devices and/or systems that receive and use Bluetooth and/or FM signals. In one embodiment of the invention, the single chip Bluetooth and FM radio may be utilized in a system comprising a WLAN radio. U.S. application Ser. No. 11/286,844, filed on Nov. 22, 2005, discloses a method and system comprising a single chip Bluetooth and FM radio integrated with a wireless LAN radio, and is hereby incorporated herein by reference in its entirety.

Figure 1B:
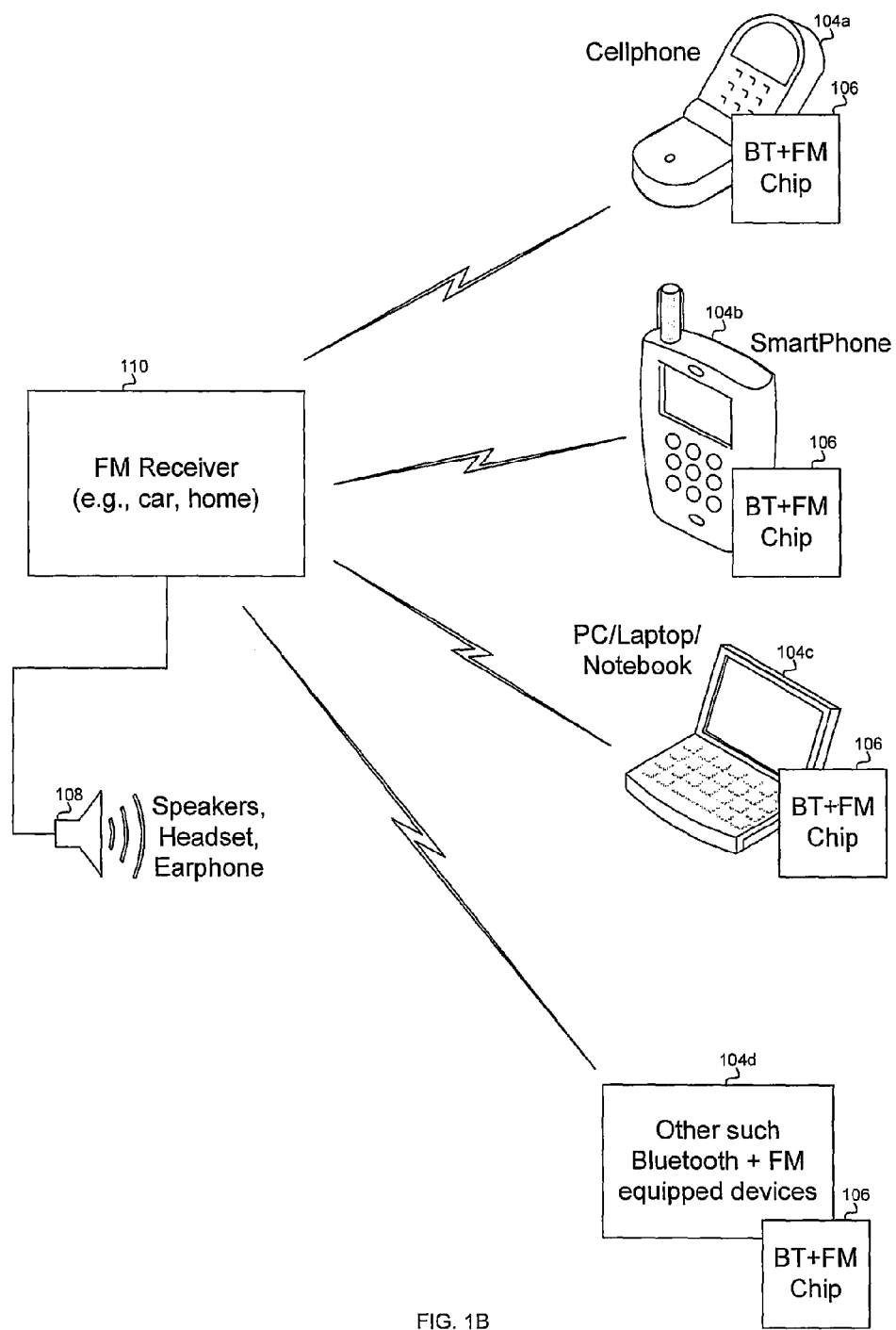
FIG. 1B is a block diagram of an exemplary FM receiver that communicates with handheld devices that utilize a single chip with integrated Bluetooth and FM radios, in accordance with an embodiment of the invention.

FIG. 1B is a block diagram of an exemplary FM receiver that communicates with handheld devices that utilize a single chip with integrated Bluetooth and FM radios, in accordance with an embodiment of the invention. Referring to FIG. 1B, there is shown an FM receiver 110, the cellular phone 104*a*, the smart phone 104*b*, the computer 104*c*, and the exemplary FM and Bluetooth-equipped device 104*d*. In this regard, the FM receiver 110 may comprise and/or may be communicatively coupled to a listening device 108. A device equipped with the Bluetooth and FM transceivers, such as the single chip 106, may be able to broadcast its respective signal to a "deadband" of an FM receiver for use by the associated audio system. For example, a cellphone or a smart phone, such as the cellular phone 104*a* and the smart phone 104*b*, may transmit a telephone call for listening over the audio system of an automobile, via usage of a deadband area of the car's FM stereo system. One advantage may be the universal ability to use this feature with all automobiles equipped simply with an FM radio with few, if any, other external FM transmission devices or connections being required.

In an exemplary embodiment of the invention, the FM receiver 110 may be adapted to provide flexible FM tuning functionalities. In this regard, the FM receiver 110 may utilize an FM receiver front-end which may be adapted to locate image channels for different channel spacing schemes. For example, based on the geographic location of the FM receiver 110, an adjustable intermediate frequency (IF) may be utilized so that the image channel may be characterized by a determined offset. During tuning to a particular frequency, a frequency error and/or a received signal strength indicator (RSSI) may be measured for the particular frequency. If the measured frequency error indicates a presence of an offset or if a detected offset is higher than a threshold value, the particular frequency may comprise an image channel. If the particular frequency comprises an image channel, the image channel may be rejected by utilizing a different injection point within the receiver front-end.

In another example, a computer, such as the computer 104*c*, may comprise an MP3 player or another digital music format player and may broadcast a signal to the deadband of an FM receiver in a home stereo system. The music on the computer may then be listened to on a standard FM receiver with few, if any, other external FM transmission devices or connections. While a cellular phone, a smart phone, and computing devices have been shown, a single chip that combines a Bluetooth and FM transceiver and/or receiver may be utilized in a plurality of other devices and/or systems that receive and use an FM signal.

Figure 1C:
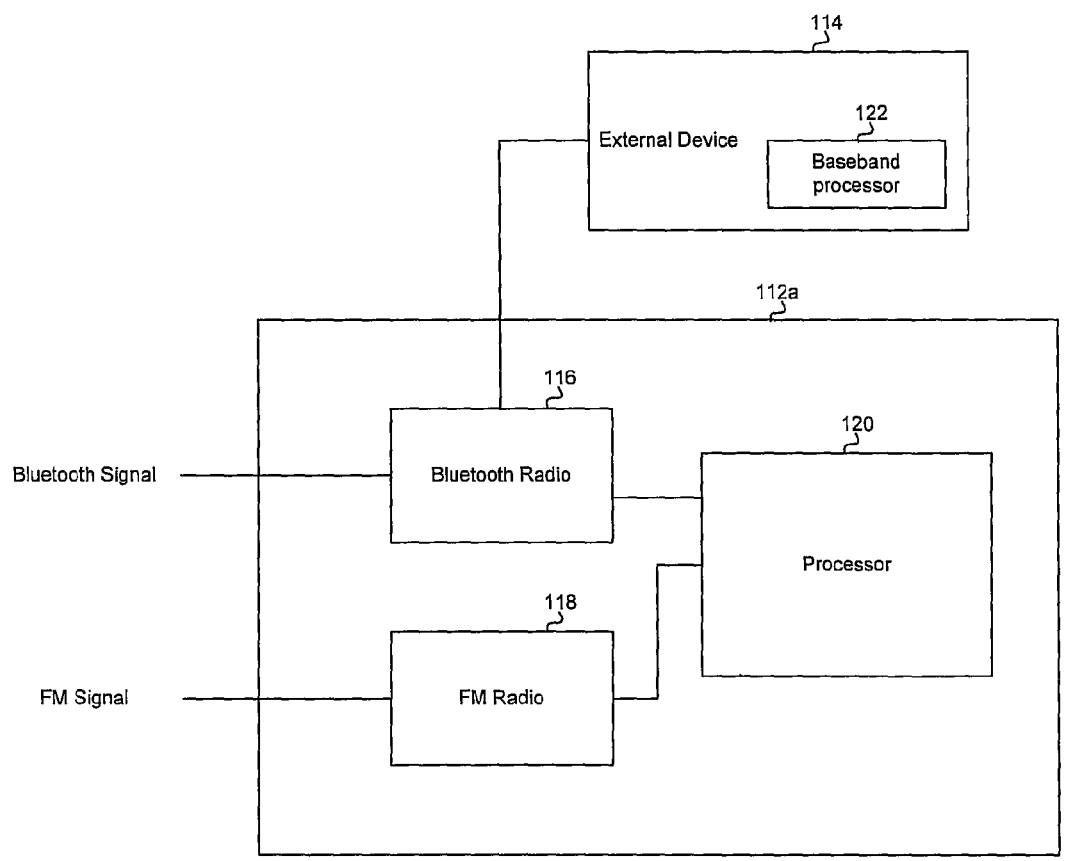
FIG. 1C is a block diagram of an exemplary single chip with integrated Bluetooth and FM radios that supports FM processing and an external device that supports Bluetooth processing, in accordance with an embodiment of the invention.

FIG. 1C is a block diagram of an exemplary single chip with integrated Bluetooth and FM radios that supports FM processing and an external device that supports Bluetooth processing, in accordance with an embodiment of the invention. Referring to FIG. 1C, there is shown a single chip 112*a* that supports Bluetooth and FM radio operations and an external device 114. The single chip 112*a* may comprise an integrated Bluetooth radio 116, an integrated FM radio 118, and an integrated processor 120. The Bluetooth radio 116 may comprise suitable logic, circuitry, and/or code that enable Bluetooth signal communication via the single chip 112*a*. In this regard, the Bluetooth radio 116 may support audio signals or communication. The FM radio may comprise suitable logic, circuitry, and/or code that enable FM signal communication via the single chip 112*a*.

The integrated processor 120 may comprise suitable logic, circuitry, and/or code that may enable processing of the FM data received by the FM radio 118. Moreover, the integrated processor 120 may enable processing of FM data to be transmitted by the FM radio 118 when the FM radio 118 comprises transmission capabilities. The external device 114 may comprise a baseband processor 122. The baseband processor 122 may comprise suitable logic, circuitry, and/or code that may enable processing of Bluetooth data received by the Bluetooth radio 116. Moreover, the baseband processor 122 may enable processing of Bluetooth data to be transmitted by the Bluetooth radio 116. In this regard, the Bluetooth radio 116 may communicate with the baseband processor 122 via the external device 114. The Bluetooth radio 116 may communicate with the integrated processor 120.

In an exemplary embodiment of the invention, the FM radio 118 may comprise an FM receiver, which may be adapted to provide flexible FM tuning functionalities. The FM receiver within the FM radio 118 may utilize an FM receiver front-end which may enable locating image channels for different channel spacing schemes. For example, based on the geographic location of the FM receiver 110, an adjustable intermediate frequency (IF) may be utilized so that the image channel may be characterized by a determined offset. During tuning to a particular frequency, a frequency error and/or a received signal strength indicator (RSSI) may be measured for the particular frequency. If the measured frequency error indicates a presence of an offset or if a detected offset is higher than a threshold value, the particular frequency may comprise an image channel. If the particular frequency comprises an image channel, the image channel may be rejected by utilizing a different injection point within the receiver front-end.

Figure 1D:
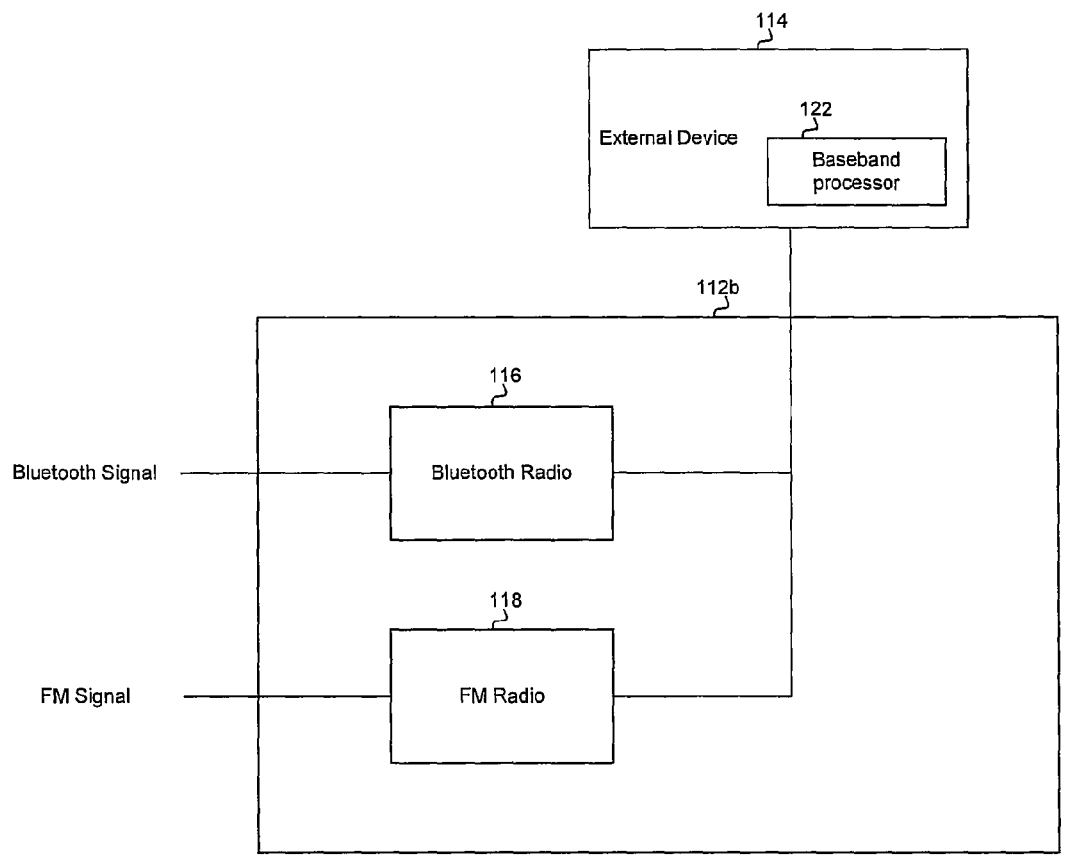
FIG. 1D is a block diagram of an exemplary single chip with integrated Bluetooth and FM radios and an external device that supports Bluetooth and FM processing, in accordance with an embodiment of the invention.

FIG. 1D is a block diagram of an exemplary single chip with integrated Bluetooth and FM radios and an external device that supports Bluetooth and FM processing, in accordance with an embodiment of the invention. Referring to FIG. 1D, there is shown a single chip 112*b* that supports Bluetooth and FM radio operations and an external device 114. The single chip 112*b* may comprise the Bluetooth radio 116 and the FM radio 118. The Bluetooth radio 116 and/or the FM radio 118 may be integrated into the single chip 112*b*. The external device 114 may comprise a baseband processor 122. The baseband processor 122 may comprise suitable logic, circuitry, and/or code that may enable processing of Bluetooth data received by the Bluetooth radio 116 and/or processing of Bluetooth data to be transmitted by the Bluetooth radio 116. In this regard, the Bluetooth radio 116 may communicate with the baseband processor 122 via the external device 114. Moreover, the baseband processor 122 may comprise suitable logic, circuitry, and/or code that may enable processing of the FM data received by the FM radio 118. The baseband processor 122 may enable processing FM data to be transmitted by the FM radio 118 when the FM radio 118 comprises transmission capabilities. In this regard, the FM radio 118 may communicate with the baseband processor 122 via the external device 114.

Figure 1E:
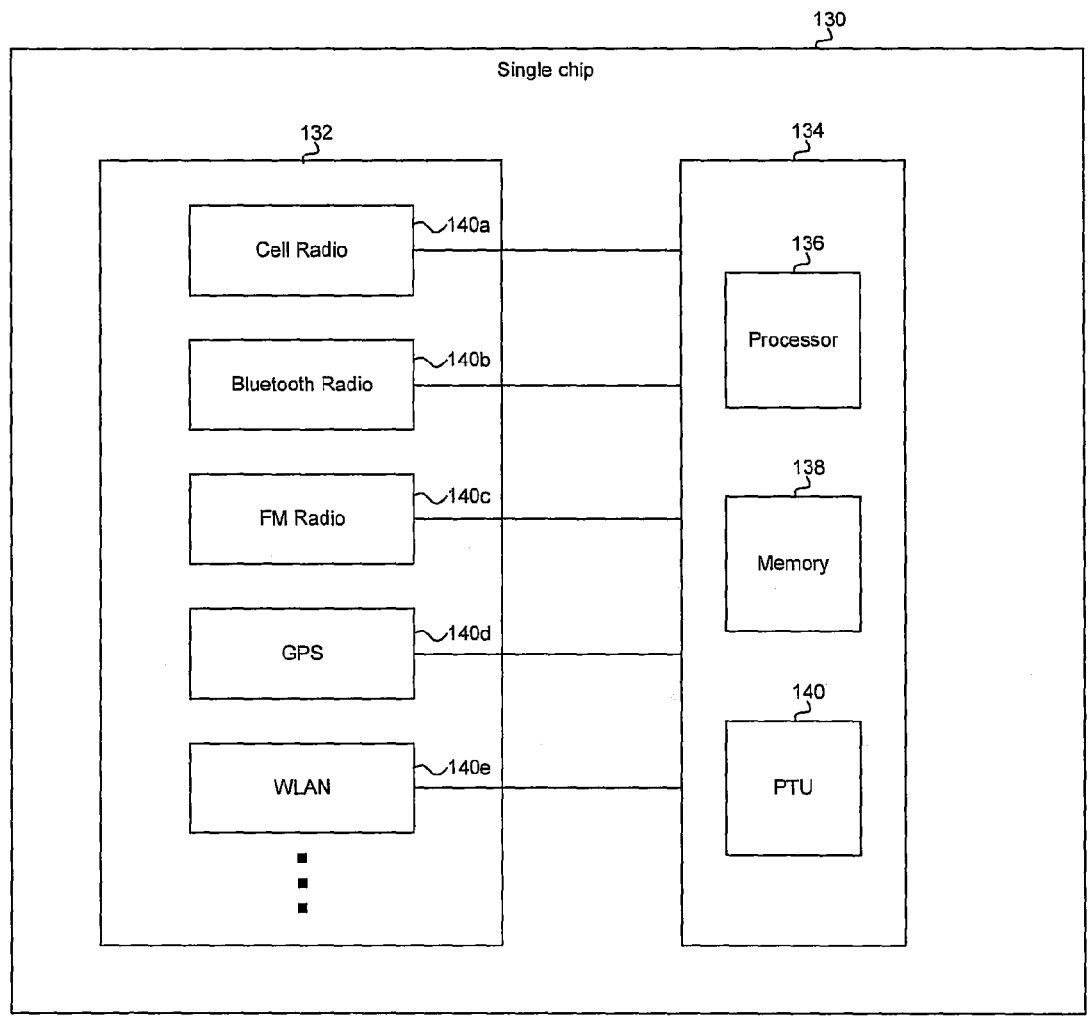
FIG. 1E is a block diagram of an exemplary single chip with multiple integrated radios that supports radio data processing, in accordance with an embodiment of the invention.

FIG. 1E is a block diagram of an exemplary single chip with multiple integrated radios that supports radio data processing, in accordance with an embodiment of the invention. Referring to FIG. 1E, there is shown a single chip 130 that may comprise a radio portion 132 and a processing portion 134. The radio portion 132 may comprise a plurality of integrated radios. For example, the radio portion 132 may comprise a cell radio 140*a* that supports cellular communications, a Bluetooth radio 140*b* that supports Bluetooth communications, an FM radio 140*c* that supports FM communications, a global positioning system (GPS) 140*d* that supports GPS communications, and/or a wireless local area network (WLAN) 140*e* that supports communications based on the IEEE 802.11 standards. The FM radio 140*c* may be similar to the FM radio 118 in FIG. 1C and may provide the flexible FM tuning functionalities as described herein.

The processing portion 134 may comprise at least one processor 136, a memory 138, and a peripheral transport unit (PTU) 140. The processor 136 may comprise suitable logic, circuitry, and/or code that enable processing of data received from the radio portion 132. In this regard, each of the integrated radios may communicate with the processing portion 134. In some instances, the integrated radios may communicate with the processing portion 134 via a common bus, for example. The memory 138 may comprise suitable logic, circuitry, and/or code that enable storage of data that may be utilized by the processor 136. In this regard, the memory 138 may store at least a portion of the data received by at least one of the integrated radios in the radio portion 132. Moreover, the memory 138 may store at least a portion of the data that may be transmitted by at least one of the integrated radios in the radio portion 132. The PTU 140 may comprise suitable logic, circuitry, and/or code that may enable interfacing data in the single chip 130 with other devices that may be communicatively coupled to the single chip 130. In this regard, the PTU 140 may support analog and/or digital interfaces.

Figure 1F:
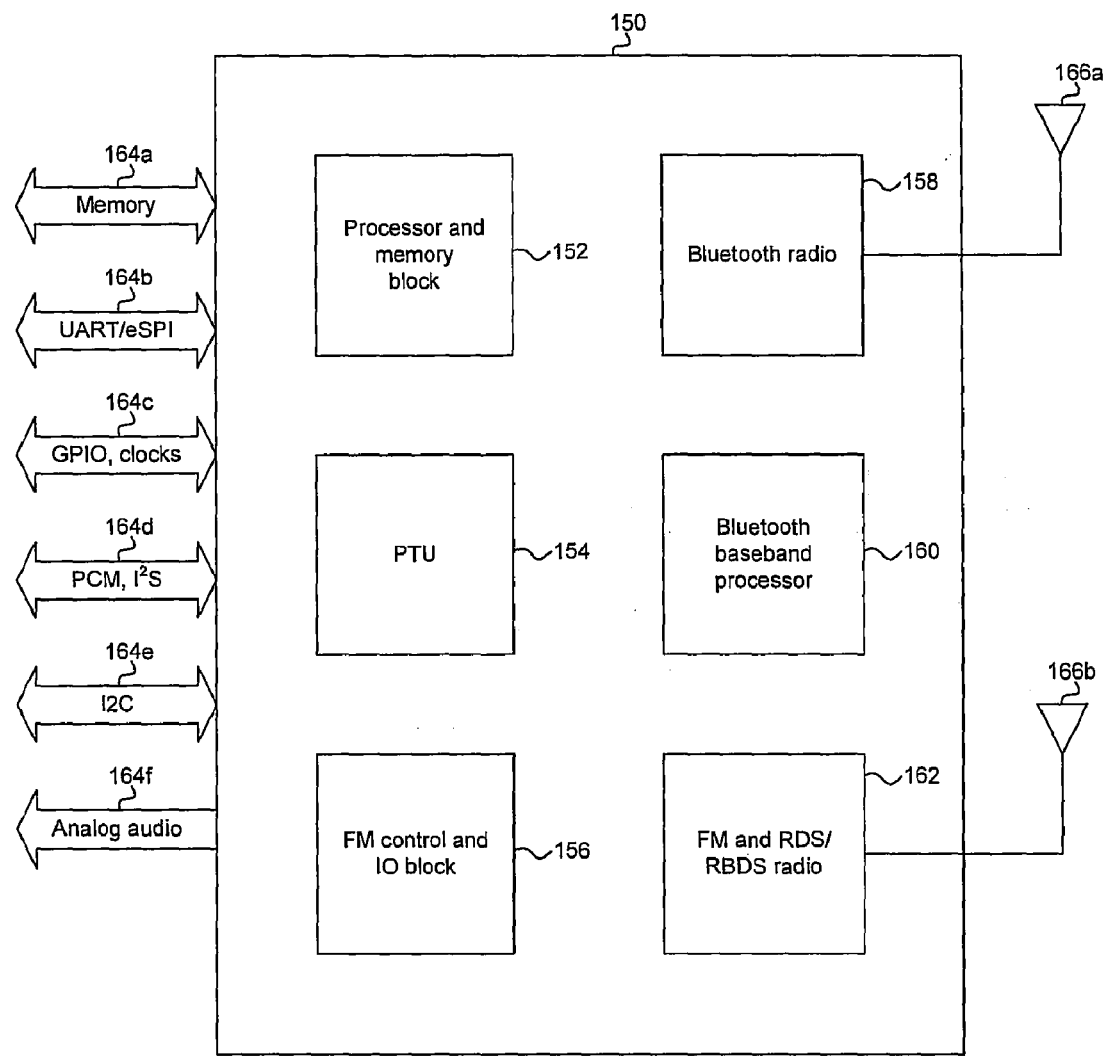
FIG. 1F is a block diagram of an exemplary single chip with integrated Bluetooth and FM radios that supports multiple interfaces, in accordance with an embodiment of the invention.

FIG. 1F is a block diagram of an exemplary single chip with integrated Bluetooth and FM radios that supports multiple interfaces, in accordance with an embodiment of the invention. Referring to FIG. 1F, there is shown a single chip 150 that supports Bluetooth and FM radio communications. The single chip 150 may comprise a processor and memory block 152, a PTU 154, an FM control and input-output (IO) block 156, a Bluetooth radio 158, a Bluetooth baseband processor 160, and an FM and radio data system (RDS) and radio broadcast data system (RDBS) radio 162. A first antenna or antenna system 166a may be communicatively coupled to the Bluetooth radio 158. A second antenna or antenna system 166b may be communicatively coupled to the FM and RDS/RBDS radio 162. The FM and RDS/RBDS radio 162 may comprise an FM receiver, which may provide flexible FM tuning functionalities as described herein.

The processor and memory block 152 may comprise suitable logic, circuitry, and/or code that may enable control, management, data processing operations, and/or data storage operations, for example. The PTU 154 may comprise suitable logic, circuitry, and/or code that may enable interfacing the single chip 150 with external devices. The FM control and IO block 156 may comprise suitable logic, circuitry, and/or code that may enable control of at least a portion of the FM and RDS/RBDS radio 162. The Bluetooth radio 158 may comprise suitable logic, circuitry, and/or code that may enable Bluetooth communications via the first antenna 166a. The FM and RDS/RBDS radio 162 may comprise suitable logic, circuitry, and/or code that may enable FM, RDS, and/or RBDS data communication via the second antenna 166b. The Bluetooth baseband processor 160 may comprise suitable logic, circuitry, and/or code that may enable processing of baseband data received from the Bluetooth radio 158 or baseband data to be transmitted by the Bluetooth radio 158.

The PTU 154 may support a plurality of interfaces. For example, the PTU 154 may support an external memory interface 164a, a universal asynchronous receiver transmitter (UART) and/or enhanced serial peripheral interface (eSPI) interface 164b, a general purpose input/output (GPIO) and/or clocks interface 164c, a pulse-code modulation (PCM) and/or an inter-IC sound ($I^2S$) interface 164d, an inter-integrated circuit ($I^2C$) bus interface 164e, and/or an audio interface 164f.

Figure 1G:
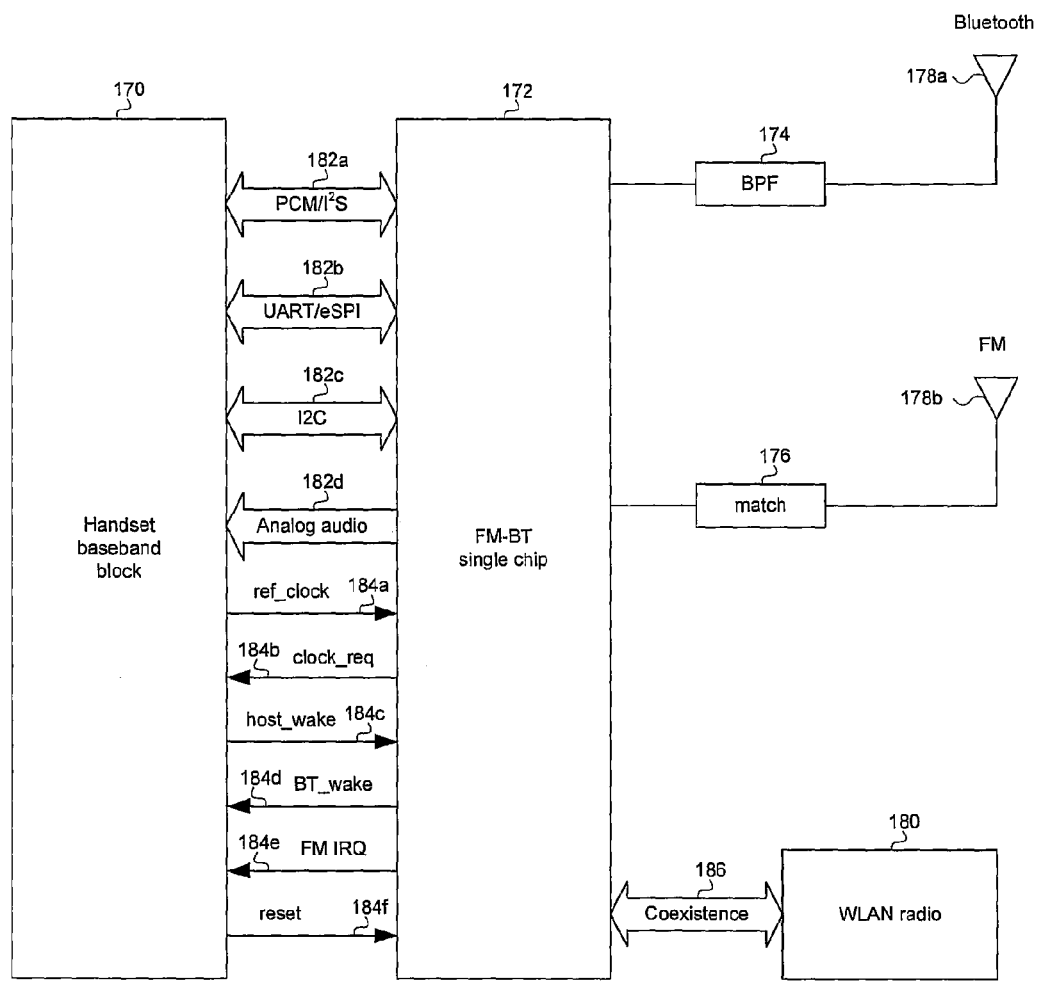
FIG. 1G is a block diagram of an exemplary single chip with integrated Bluetooth and FM radios that supports interfacing with a handset baseband device and a coexistent wireless LAN (WLAN) radio, in accordance with an embodiment of the invention.

FIG. 1G is a block diagram of an exemplary single chip with integrated Bluetooth and FM radios that supports interfacing with a handset baseband device and a coexistent wireless LAN (WLAN) radio, in accordance with an embodiment of the invention. Referring to FIG. 1G, there is shown a single chip 172, a handset baseband block 170, a band pass filter 174, a first antenna or antenna system 178a, a matching circuit 176, a second antenna or antenna filter 178b, and a WLAN radio 180. The single chip 172 may be substantially similar to the single chip 150. In this instance, the single chip 172 may comprise suitable logic, circuitry, and/or code that may enable coexistent operation with the WLAN radio 180 via the coexistence interface 186.

The single chip 172 may communicate Bluetooth data via the BPF 174 and the first antenna 178a. The single chip 172 may also communicate FM data via the matching circuit 176 and the second antenna 178b. The single chip 172 may coordinate Bluetooth data communication in the presence of WLAN channels by communicating with the WLAN radio 180 via the coexistence interface 186. The single chip 172 may comprise an FM receiver, which may provide flexible FM tuning functionalities as described herein.

The single chip 172 may transfer data to the handset baseband block 170 via at least one interface, such as a PCM/I2S interface 182a, a UART/eSPI interface 182b, a $I^2C$ interface 182c, and/or and analog audio interface 182d. The single chip 172 and the handset baseband block 170 may also communicate via at least one control signal. For example, the handset baseband block 170 may generate a clock signal, ref_clock, 184a, a wake signal, host_wake 184c, and/or a reset signal 184f that may be transferred to the single chip 172. Similarly, the single chip 172 may generate a clock request signal, clock_req, 184b, a Bluetooth wake signal, BT_wake, 184d, and/or an FM interrupt request signal, FM IRQ, 184e that may be transferred to the handset baseband block 170. The handset baseband block 170 may comprise suitable logic, circuitry, and/or code that may enable processing of at least a portion of the data received from the single chip 172 and/or data to be transferred to the single chip 172. In this regard, the handset baseband block 170 may transfer data to the single chip 172 via at least one interface.

Figure 2A:
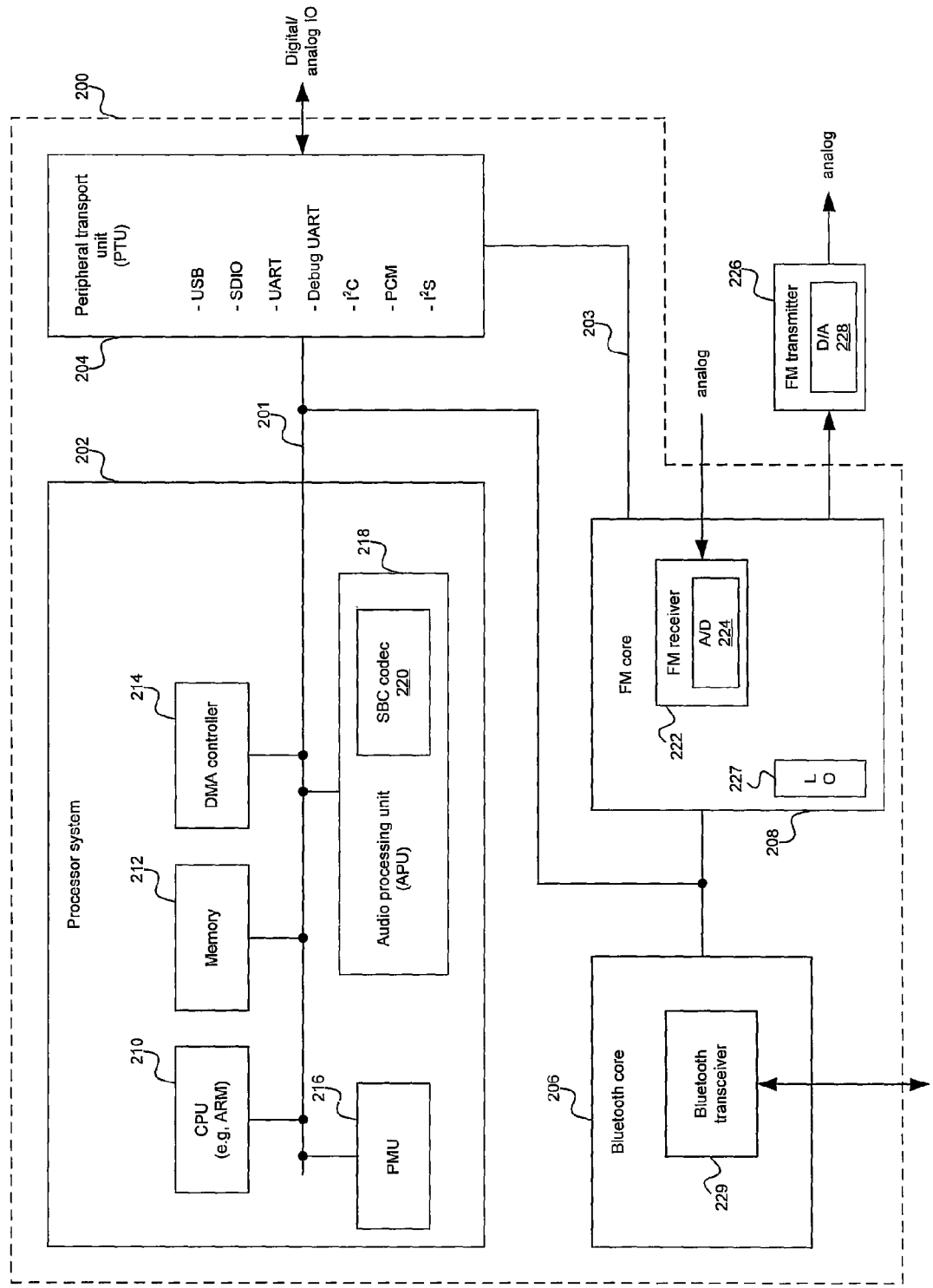
FIG. 2A is a block diagram of an exemplary single chip that supports Bluetooth and FM operations with an external FM transmitter, in accordance with an embodiment of the invention.

FIG. 2A is a block diagram of an exemplary single chip that supports Bluetooth and FM operations with an external FM transmitter, in accordance with an embodiment of the invention. Referring to FIG. 2A, there is shown a single chip 200 that may comprise a processor system 202, a peripheral transport unit (PTU) 204, a Bluetooth core 206, a frequency modulation (FM) core 208, and a common bus 201. An FM transmitter 226 may be an external device to the single chip 200 and may be communicatively coupled to the single chip 200 via the FM core 208, for example. The FM transmitter 226 may be a separate integrated circuit (IC), for example.

The processor system 202 may comprise a central processing unit (CPU) 210, a memory 212, a direct memory access (DMA) controller 214, a power management unit (PMU) 216, and an audio processing unit (APU) 218. The APU 218 may comprise a subband coding (SBC) codec 220. At least a portion of the components of the processor system 202 may be communicatively coupled via the common bus 201.

The CPU 210 may comprise suitable logic, circuitry, and/ or code that may enable control and/or management operations in the single chip 200. In this regard, the CPU 210 may communicate control and/or management operations to the Bluetooth core 206, the FM core 208, and/or the PTU 204 via a set of register locations specified in a memory map. Moreover, the CPU 210 may be utilized to process data received by the single chip 200 and/or to process data to be transmitted by the single chip 200. The CPU 210 may enable processing of data received via the Bluetooth core 206, via the FM core 208, and/or via the PTU 204. For example, the CPU 210 may enable processing of A2DP data and may then transfer the processed A2DP data to other components of the single chip 200 via the common bus 201. In this regard, the CPU may utilize the SBC codec 220 in the APU 218 to encode and/or decode A2DP data, for example. The CPU 210 may enable processing of data to be transmitted via Bluetooth core 206, via the FM core 208, and/or via the PTU 204. The CPU 210 may be, for example, an ARM processor or another embedded processor core that may be utilized in the implementation of system-on-chip (SOC) architectures.

The CPU 210 may time multiplex Bluetooth data processing operations and FM data processing operations. In this regard, the CPU 210 may perform each operation by utilizing a native clock, that is, Bluetooth data processing based on a Bluetooth clock and FM data processing based on an FM clock. The Bluetooth clock and the FM clock may be distinct and may not interact. The CPU 210 may gate the FM clock and the Bluetooth clock and may select the appropriate clock in accordance with the time multiplexing scheduling or arrangement. When the CPU 210 switches between Bluetooth operations and FM operations, at least certain states associated with the Bluetooth operations or with the FM operations may be retained until the CPU 210 switches back.

For example, in the case where the Bluetooth function is not active and is not expected to be active for some time, the CPU 210 may run on a clock derived from the FM core 208. This may eliminate the need to bring in a separate high-speed clock when one is already available in the FM core 208. In the case where the Bluetooth core 206 may be active, for example when the Bluetooth is in a power-saving mode that requires it to be active periodically, the processor may chose to use a clock derived separately from the FM core 208. The clock may be derived directly from a crystal or oscillator input to the Bluetooth core 206, or from a phase locked loop (PLL) in the Bluetooth core 206. While this clocking scheme may provide certain flexibility in the processing operations performed by the CPU 210 in the single chip 200, other clocking schemes may also be implemented.

The CPU 210 may also enable configuration of data routes to and/or from the FM core 208. For example, the CPU 210 may configure the FM core 208 so that data may be routed via an $I^2S$ interface or a PCM interface in the PTU 204 to the analog ports communicatively coupled to the PTU 204.

The CPU 210 may enable tuning, such as flexible tuning, and/or searching operations in Bluetooth and/or FM communication by controlling at least a portion of the Bluetooth core 206 and/or the FM core 208. For example, the CPU 210 may generate at least one signal that tunes the FM core 208 to a certain frequency to determine whether there is a station at that frequency. When a station is found, the CPU 210 may configure a path for the audio signal to be processed in the single chip 200. When a station is not found, the CPU 210 may generate at least one additional signal that tunes the FM core 208 to a different frequency to determine whether a station may be found at the new frequency.

Searching algorithms may enable the FM core 208 to scan up or down in frequency from a presently tuned channel and stop on the next channel with received signal strength indicator (RSSI) above a threshold. The search algorithm may be able to distinguish image channels. The choice of the IF frequency during search is such that an image channel may have a nominal frequency error of 50 kHz, which may be used to distinguish the image channel from the "on" channel. The search algorithm may also be able to determine if a high side or a low side injection provides better receive performance, thereby allowing for a signal quality metric to be developed for this purpose. One possibility to be investigated is monitoring the high frequency RSSI relative to the total RSSI. The IF may be chosen so that with the timing accuracy that a receiver may be enabled to provide, the image channels may comprise a frequency error that is sufficiently large to differentiate the image channels from the on channel.

The CPU 210 may enable a host controller interface (HCI) in Bluetooth. In this regard, the HCI provides a command interface to the baseband controller and link manager, and access to hardware status and control registers. The HCI may provide a method of accessing the Bluetooth baseband capabilities that may be supported by the CPU 210.

The memory 212 may comprise suitable logic, circuitry, and/or code that may enable data storage. In this regard, the memory 212 may be utilized to store data that may be utilized by the processor system 202 to control and/or manage the operations of the single chip 200. The memory 212 may also be utilized to store data received by the single chip 200 via the PTU 204 and/or via the FM core 208. Similarly, the memory 212 may be utilized to store data to be transmitted by the single chip 200 via the PTU 204 and/or via the FM core 208. The DMA controller 214 may comprise suitable logic, circuitry, and/or code that may enable transfer of data directly to and from the memory 212 via the common bus 201 without involving the operations of the CPU 210.

The PTU 204 may comprise suitable logic, circuitry, and/or code that may enable communication to and from the single chip 200 via a plurality of communication interfaces. In some instances, the PTU 204 may be implemented outside the single chip 200, for example. The PTU 204 may support analog and/or digital communication with at least one port. For example, the PTU 204 may support at least one universal series bus (USB) interface that may be utilized for Bluetooth data communication, at least one secure digital input/output (SDIO) interface that may also be utilized for Bluetooth data communication, at least one universal asynchronous receiver transmitter (UART) interface that may also be utilized for Bluetooth data communication, and at least one $I^2C$ bus interface that may be utilized for FM control and/or FM and RDS/RBDS data communication. The PTU 204 may also support at least one PCM interface that may be utilized for Bluetooth data communication and/or FM data communication, for example.

The PTU 204 may also support at least one inter-IC sound ($I^2S$) interface, for example. The $I^2S$ interface may be utilized to send high fidelity FM digital signals to the CPU 210 for processing, for example. In this regard, the $I^2S$ interface in the PTU 204 may receive data from the FM core 208 via a bus 203, for example. Moreover, the $I^2S$ interface may be utilized to transfer high fidelity audio in Bluetooth. For example, in the A2DP specification there is support for wideband speech that utilizes 16 kHz of audio. In this regard, the $I^2S$ interface may be utilized for Bluetooth high fidelity data communication and/or FM high fidelity data communication. The $I^2S$ interface may be a bidirectional interface and may be utilized to support bidirectional communication between the PTU 204 and the FM core 208 via the bus 203. The $I^2S$ interface may be utilized to send and receive FM data from external devices such as coder/decoders (CODECs) and/or other devices that may further process the $I^2S$ data for transmission, such as local transmission to speakers and/or headsets and/or remote transmission over a cellular network, for example.

The Bluetooth core 206 may comprise suitable logic, circuitry, and/or code that may enable reception and/or transmission of Bluetooth data. The Bluetooth core 206 may comprise a Bluetooth transceiver 229 that may perform reception and/or transmission of Bluetooth data. In this regard, the Bluetooth core 206 may support amplification, filtering, modulation, and/or demodulation operations, for example. The Bluetooth core 206 may enable data to be transferred from and/or to the processor system 202, the PTU 204, and/or the FM core 208 via the common bus 201, for example.

The FM core 208 may comprise suitable logic, circuitry, and/or code that may enable reception and/or transmission of FM data. The FM core 208 may comprise an FM receiver 222 and a local oscillator (LO) 227. The FM receiver 222 may comprise an analog-to-digital (A/D) converter 224. The FM receiver 222 may support amplification, filtering, and/or demodulation operations, for example. The LO 227 may be utilized to generate a reference signal that may be utilized by the FM core 208 for performing analog and/or digital operations. The FM core 206 may enable data to be transferred from and/or to the processor system 202, the PTU 204, and/or the Bluetooth core 206 via the common bus 201, for example. Moreover, the FM core 208 may receive analog FM data via the FM receiver 222. The FM receiver 222 may provide flexible FM tuning functionalities as described herein.

The A/D converter 224 in the FM receiver 222 may be utilized to convert the analog FM data to digital FM data to enable processing by the FM core 208. The FM core 208 may also enable the transfer of digital FM data to the FM transmitter 226. The FM transmitter 226 may comprise a digital-to-analog (D/A) converter 228 that may be utilized to convert digital FM data to analog FM data to enable transmission by the FM transmitter 226. Data received by the FM core 208 may be routed out of the FM core 208 in digital format via the common bus 201 and/or in analog format via the bus 203 to the I²S interface in the PTU 204, for example.

The FM core 208 may enable radio transmission and/or reception at various frequencies, such as, 400 MHz, 900 MHz, 2.4 GHz and/or 5.8 GHz, for example. The FM core 208 may also support operations at the standard FM band comprising a range of about 76 MHz to 108 MHz, for example.

The FM core 208 may also enable reception of RDS data and/or RBDS data for in-vehicle radio receivers. In this regard, the FM core 208 may enable filtering, amplification, and/or demodulation of the received RDS/RBDS data. The RDS/RBDS data may comprise, for example, a traffic message channel (TMC) that provides traffic information that may be communicated and/or displayed to an in-vehicle user.

Digital circuitry within the FM core 208 may be operated based on a clock signal generated by dividing down a signal generated by the LO 227. The LO 227 may be programmable in accordance with the various channels that may be received by the FM core 208 and the divide ratio may be varied in order to maintain the digital clock signal close to a nominal value.

The RDS/RBDS data may be buffered in the memory 212 in the processor system 202. The RDS/RBDS data may be transferred from the memory 212 via the I²C interface when the CPU 210 is in a sleep or stand-by mode. For example, the FM core 208 may post RDS data into a buffer in the memory 212 until a certain level is reached and an interrupt is generated to wake up the CPU 210 to process the RDS/RBDS data. When the CPU 210 is not in a sleep mode, the RDS data may be transferred to the memory 212 via the common bus 201, for example.

Moreover, the RDS/RBDS data received via the FM core 208 may be transferred to any of the ports communicatively coupled to the PTU 204 via the HCI scheme supported by the single chip 200, for example. The RDS/RBDS data may also be transferred to the Bluetooth core 206 for communication to Bluetooth-enabled devices.

In one exemplary embodiment of the invention, the single chip 200 may receive FM audio data via the FM core 208 and may transfer the received data to the Bluetooth core 206 via the common bus 201. The Bluetooth core 206 may transfer the data to the processor system 202 to be processed. In this regard, the SBC codec 220 in the APU 218 may perform SBC coding or other A2DP compliant audio coding for transportation of the FM data over a Bluetooth A2DP link. The processor system 202 may also enable performing continuous variable slope delta (CVSD) modulation, log pulse code modulation (Log PCM), and/or other Bluetooth compliant voice coding for transportation of FM data on Bluetooth synchronous connection-oriented (SCO) or extended SCO (eSCO) links. The Bluetooth-encoded FM audio data may be transferred to the Bluetooth core 206, from which it may be communicated to another device that supports the Bluetooth protocol. The CPU 210 may be utilized to control and/or manage the various data transfers and/or data processing operations in the single chip 200 to support the transmission of FM audio data via the Bluetooth protocol.

Moreover, when Bluetooth data is received, such as A2DP, SCO, eSCO, and/or MP3, for example, the Bluetooth core 206 may transfer the received data to the processor system 202 via the common bus 201. At the processor system 202, the SBC codec 220 may decode the Bluetooth data and may transfer the decoded data to the FM core 208 via the common bus 201. The FM core 208 may transfer the data to the FM transmitter 226 for communication to an FM receiver in another device.

In another exemplary embodiment of the invention, the single chip 200 may operate in a plurality of modes. For example, the single chip 200 may operate in one of an FM-only mode, a Bluetooth-only mode, and an FM-Bluetooth mode. For the FM-only mode, the single chip 200 may operate with a lower power active state than in the Bluetooth-only mode or the FM-Bluetooth mode because FM operation in certain devices may have a limited source of power. In this regard, during the FM-only mode, at least a portion of the operation of the Bluetooth core 206 may be disabled to reduce the amount of power used by the single chip 200. Moreover, at least a portion of the processor system 202, such as the CPU 210, for example, may operate based on a divided down clock from a phase locked-loop (PLL) in the FM core 208. In this regard, the PLL in the FM core 208 may utilize the LO 227, for example.

Moreover, because the code necessary to perform certain FM operations, such as tuning and/or searching, for example, may only require the execution of a few instructions in between time intervals of, for example, 10 ms, the CPU 210 may be placed on a stand-by or sleep mode to reduce power consumption until the next set of instructions is to be executed. In this regard, each set of instructions in the FM operations code may be referred to as a fragment or atomic sequence. The fragments may be selected or partitioned in a very structured manner to optimize the power consumption of the single chip 200 during FM-only mode operation. In some instances, fragmentation may also be implemented in the FM-Bluetooth mode to enable the CPU 210 to provide more processing power to Bluetooth operations when the FM core 208 is carrying out tuning and/or searching operations, for example.

Figure 2B:
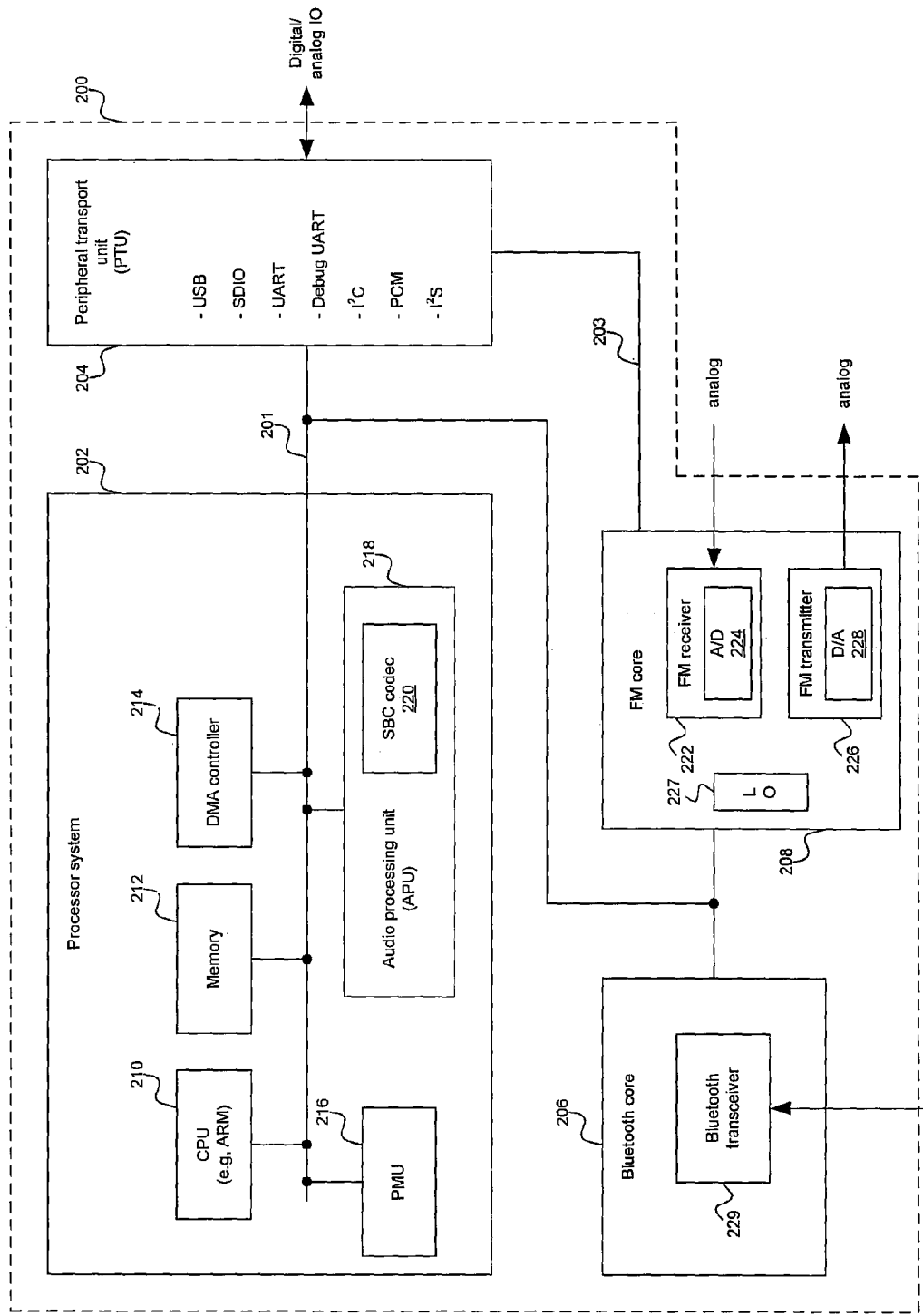
FIG. 2B is a block diagram of an exemplary single chip that supports Bluetooth and FM operations with an integrated FM transmitter, in accordance with an embodiment of the invention.

FIG. 2B is a block diagram of an exemplary single chip that supports Bluetooth and FM operations with an integrated FM transmitter, in accordance with an embodiment of the invention. Referring to FIG. 2B, there is shown the single chip 200 as described in FIG. 2A with the FM transmitter 226 integrated into the FM core 208. In this regard, the FM core 208 may support FM reception and/or transmission of FM data. The FM transmitter 226 may utilize signals generated based on the reference signal generated by the LO 227. The FM core 208 may enable transmission of data received via the PTU 204 and/or the Bluetooth core 206, for example. The exemplary implementation of the single chip 200 as described in FIG. 2B may support FM reception and/or transmission and Bluetooth reception and/or transmission.

Figure 2C:
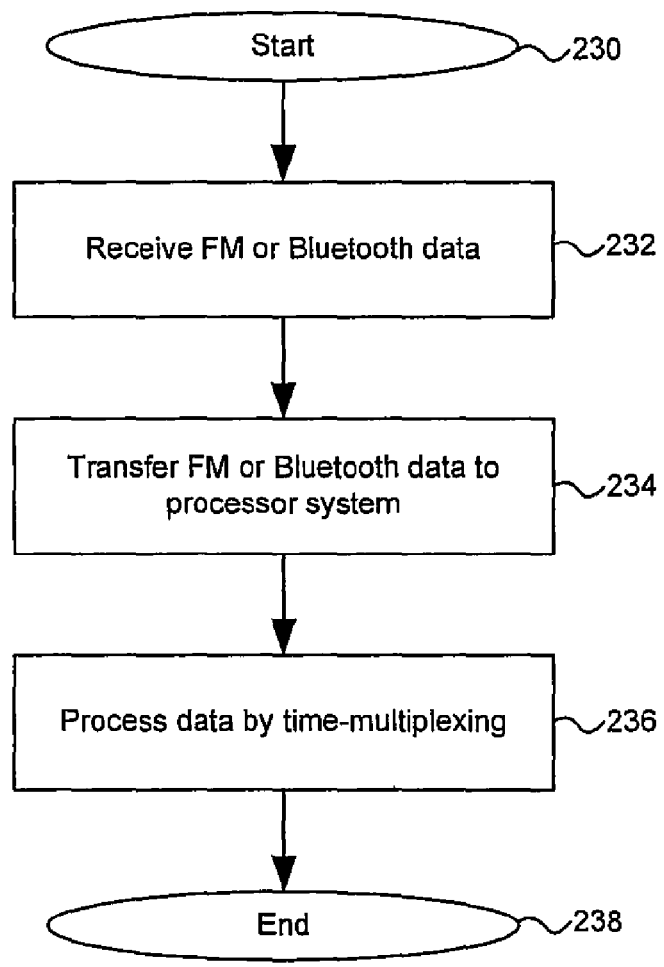
FIG. 2C is a flow diagram that illustrates exemplary steps for processing received data in a single chip with integrated Bluetooth and FM radios, in accordance with an embodiment of the invention.

FIG. 2C is a flow diagram that illustrates exemplary steps for processing received data in a single chip with integrated Bluetooth and FM radios, in accordance with an embodiment of the invention. Referring to FIGS. 2A and 2C, in step 232, after start step 230, the FM core 208 or the Bluetooth core 206 may receive data. For example, the FM core 208 may receive FM data via the FM receiver 222 and the Bluetooth core 206 may receive Bluetooth data via the Bluetooth transceiver 229. In step 234, the received data may be transferred to the processor system 202 via the common bus 201 for processing. The received data may be transferred to the memory 212 by the DMA controller 214, for example. In some instances, the processor system 202 may then transfer the data to the PTU 204, for example. The received data may be transferred to the processing system 202 in accordance with the time multiplexing schedule or arrangement provided by the processing system 202. In step 236, the processor system 202 may time multiplex the processing of FM data and the processing of Bluetooth data. For example, when Bluetooth data is being processed, FM data may not be transferred to the processing system 202 or may be transferred and stored in the memory 212 until FM processing is enabled. When the processing system 202 has completed processing the Bluetooth data, the FM data may be transferred to the processing system 202 for FM processing. Similarly, when FM data is being processed, Bluetooth data may not be transferred to the processing system 202 or may be transferred and stored in the memory 212 until Bluetooth processing is enabled. When the processing system 202 has completed processing the FM data, the Bluetooth data may be transferred to the processing system 202 for Bluetooth processing. After step 236, the process may proceed to end step 238.

Figure 2D:
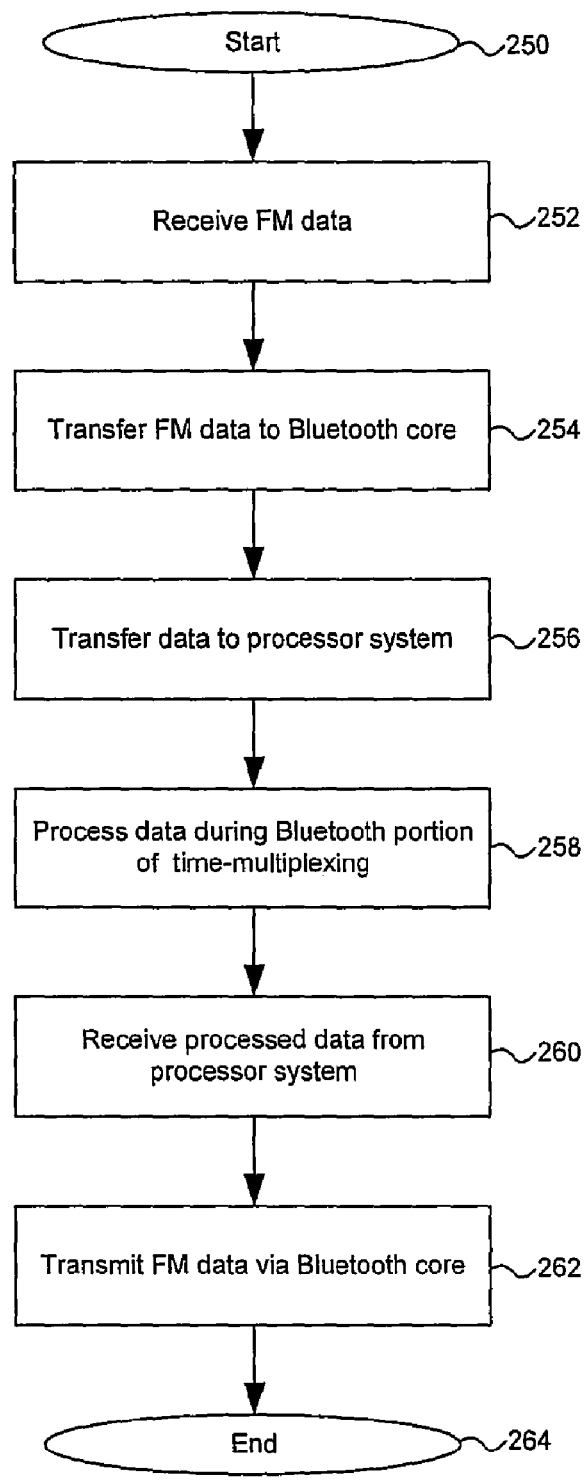
FIG. 2D is a flow diagram that illustrates exemplary steps for processing FM data via the Bluetooth core in a single chip with integrated Bluetooth and FM radios, in accordance with an embodiment of the invention.

FIG. 2D is a flow diagram that illustrates exemplary steps for processing FM data via the Bluetooth core in a single chip with integrated Bluetooth and FM radios, in accordance with an embodiment of the invention. Referring to FIGS. 2A and 2D, after start step 250, in step 252, the FM core 208 may receive FM data via the FM receiver 222. In step 254, the FM core 208 may transfer the FM data to the Bluetooth core 206 via the common bus 201. In step 256, the Bluetooth core 206 may transfer the FM data received from the FM core 208 to the processor system 202 via the common bus 201. In step 258, the processor system 202 may perform Bluetooth processing operations, such as encoding for example, to the FM data received from the Bluetooth core 206. In step 260, the Bluetooth core 206 may receive the processed FM data. In step 262, the Bluetooth core 206 may transfer the processed FM data to at least one Bluetooth-enable device via the Bluetooth transceiver 229.

An illustrative instance where the exemplary steps described in FIG. 2D may occur is when a handset is enabled to receive FM data and the handset may be enabled to operate with a Bluetooth headset. In this regard, the handset may receive the FM audio signal via the FM core 208 and may process the received signal for transfer to the headset via the Bluetooth core 206.

Figure 2E:
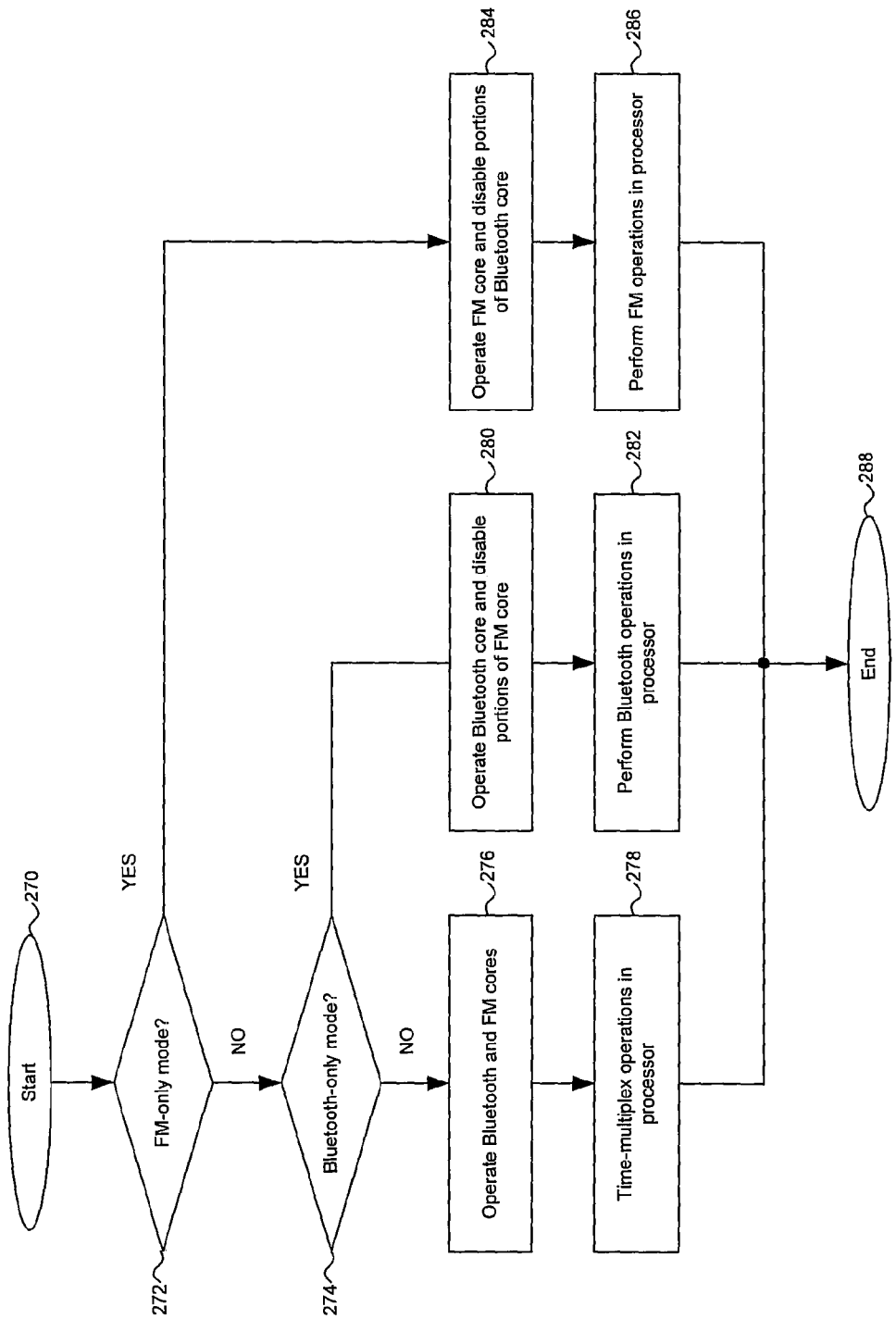
FIG. 2E is a flow diagram that illustrates exemplary steps for configuring a single chip with integrated Bluetooth and FM radios based on the mode of operation, in accordance with an embodiment of the invention.

FIG. 2E is a flow diagram that illustrates exemplary steps for configuring a single chip with integrated Bluetooth and FM radios based on the mode of operation, in accordance with an embodiment of the invention. Referring to FIG. 2E, after start step 270, in step 272, when a single chip with integrated Bluetooth and FM radios operates in an FM-only mode, the process may proceed to step 284. In step 284, the FM core 208 may be configured for operation and at least portions of the Bluetooth core 206 may be disabled. In step 286, FM data received and/or FM data to be transmitted may be processed in the processor system 202 without need for time multiplexing.

Returning to step 272, when the single chip is not operating in the FM-only mode, the process may proceed to step 274. In step 274, when the single chip is operating in the Bluetooth-only mode, the process may proceed to step 280. In step 280, the Bluetooth core 206 may be configured for operation and at least portions of the FM core 208 may be disabled. In step 282, Bluetooth data received and/or Bluetooth data to be transmitted may be processed in the processor system 202 without need for time multiplexing.

Returning to step 274, when the single chip is not operating in the Bluetooth-only mode, the process may proceed to step 276. In step 276, the Bluetooth core 206 and the FM core 208 may be configured for operation. In step 278, Bluetooth data and/or FM data may be processed in the processor system 202 in accordance with time multiplexing schedule or arrangement.

Figure 3:
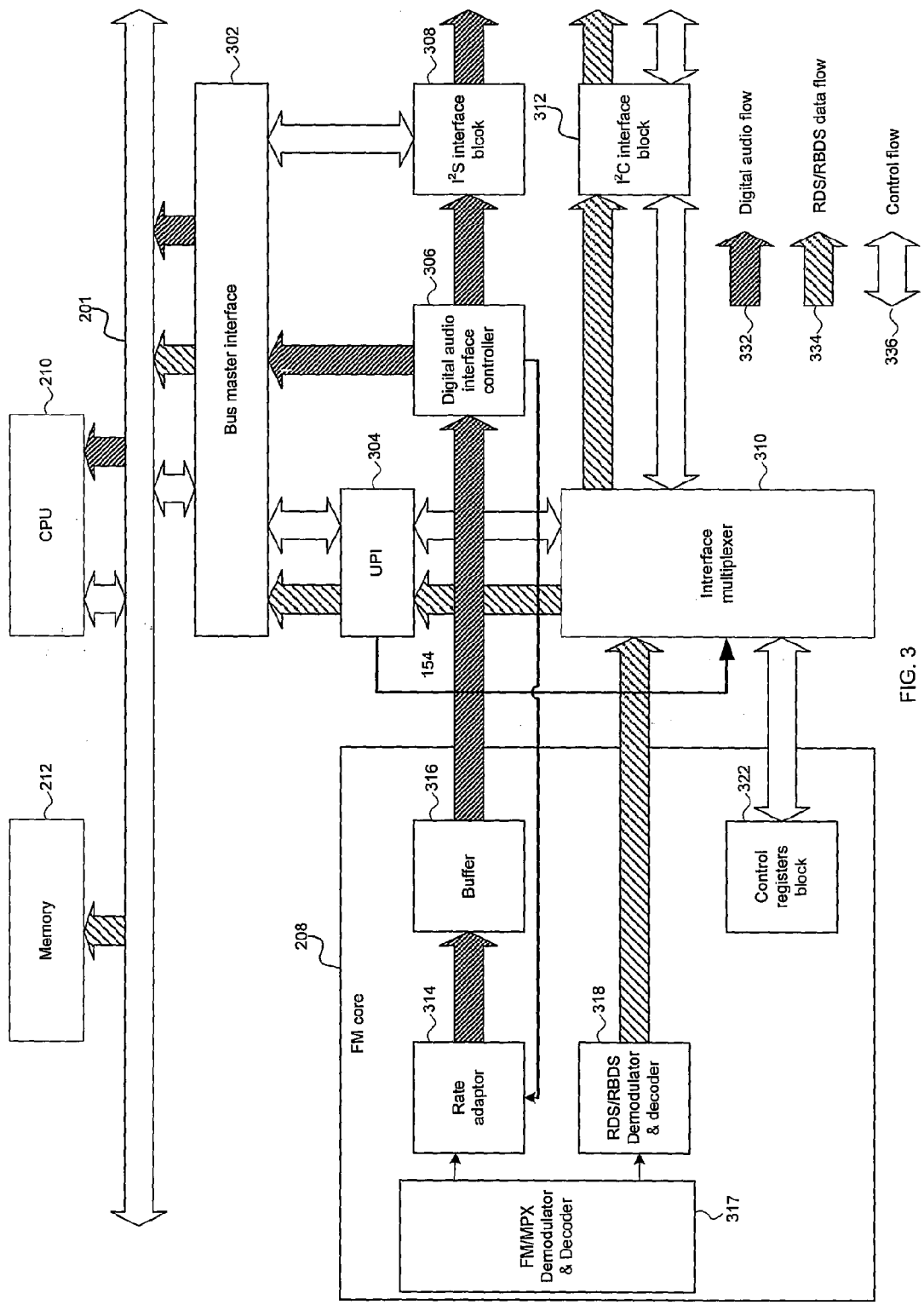
FIG. 3 is a block diagram of an exemplary FM core and PTU for processing RDS and digital audio data, in accordance with an embodiment of the invention.

FIG. 3 is a block diagram of an exemplary FM core and PTU for processing RDS and digital audio data, in accordance with an embodiment of the invention. Referring to FIG. 3, there is shown a more detailed portion of the single chip 200 described in FIGS. 2A-2B. The portion of the single chip 200 shown in FIG. 3 comprises the FM core 208, the memory 212, the CPU 210, and the common bus 201. Also shown are portions of the PTU 204 comprising an interface multiplexer 310, a universal peripheral interface (UPI) 304, a bus master interface 302, a digital audio interface controller 306, an I$^2$S interface block 308, and an I2C interface block 312. The FM core 208 may comprise a rate adaptor 314, a buffer 316, an FM/MPX demodulator and decoder 317, an RDS/RBDS demodulator and decoder 318, and a control registers block 322. Narrowly spaced hashed arrows as illustrated by the flow arrow 332 show the flow of digital audio data. Broadly spaced hashed arrows as illustrated by the flow arrow 334 show the flow of RDS/RBDS data. Clear or blank arrows, as illustrated by the dual flow arrow 336, show the flow of control data.

The FM/MPX demodulator and decoder 317 may comprise suitable logic, circuitry, and/or code that may enable processing of FM and/or FM MPX stereo audio, for example. The FM/MPX demodulator and decoder 317 may demodulate and/or decode audio signals that may be transferred to the rate adaptor 314. The FM/MPX demodulator and decoder 317 may demodulate and/or decode signals that may be transferred to the RDS/RBDS demodulator and decoder 318. The rate adaptor 314 may comprise suitable logic, circuitry, and/or code that may enable controlling the rate of the FM data received from the FM/MPX demodulator and decoder 317. The rate adaptor 314 may comprise suitable logic, circuitry, and/or code that may enable controlling the rate of the FM data received by the FM core 208. The rate adaptor 314 may adapt the output sampling rate of the audio paths to the sampling clock of the host device or the rate of a remote device when a digital audio interface is used to transport the FM data. An initial rough estimate of the adaptation fractional change may be made and the estimate may then refined by monitoring the ratio of reading and writing rates and/or by monitoring the level of the audio samples in the output buffer. The rate may be adjusted in a feedback manner such that the level of the output buffer is maintained. The rate adaptor 314 may receive a strobe or pull signal from the digital audio interface controller 306, for example. Audio FM data from the rate adaptor 314 may be transferred to the buffer 316.

The buffer 316 may comprise suitable logic, circuitry, and/or code that may enable storage of digital audio data. The buffer 316 may receive a strobe or pull signal from the digital audio interface controller 306, for example. The buffer 316 may transfer digital audio data to the digital audio interface controller 306. The digital audio interface controller 306 may comprise suitable logic, circuitry, and/or code that may enable the transfer of digital audio data to the bus master interface 302 and/or the I²S interface block 308. The I²S interface 308 may comprise suitable logic, circuitry, and/or code that may enable transfer of the digital audio data to at least one device communicatively coupled to the single chip. The I²S interface 308 may communicate control data with the bus master interface 302.

The FM demodulator 317 may comprise suitable circuitry, logic, and/or code and may enable demodulation of signals received by the FM core 208. The RDS/RBDS demodulator and decoder 318 may comprise suitable logic, circuitry, and/or code that may enable processing of RDS/RBDS data from the FM/MPX demodulator and decoder 317. The RDS/RBDS demodulator and decoder 318 may provide further demodulation and/or decoding to data received from the FM/MPX demodulator and decoder 317. The output of the RDS/RBDS decoder 318 may be transferred to the interface multiplexer 310. The interface multiplexer 310 may comprise suitable logic, circuitry, and/or code that may enable the transfer of RDS/RBDS data to the UPI 304 and/or the I²C interface block 312. In this regard, the UPI 304 may generate a signal that indicates to the interface multiplexer 310 the interface to select. The I²C interface 312 may comprise suitable logic, circuitry, and/or code that may enable transfer of the RDS/RBDS data to at least one device communicatively coupled to the single chip. The I²C interface 312 may also communicate control data between external devices to the single chip and the interface multiplexer 310. In this regard, the interface multiplexer 310 may communicate control data between the I²C interface 312, the UPI 304, and/or the control registers block 322 in the FM core 208. The control registers block 322 may comprise suitable logic, circuitry, and/or code that may enable the storage of register information that may be utilized to control and/or configure the operation of at least portions of the FM core 208.

The UPI 304 may comprise suitable logic, circuitry, and/or code that may enable the transfer of digital audio data to the bus master interface 302 from the interface multiplexer 310. The UPI 304 may also enable the communication of control data between the bus master interface 302 and the interface multiplexer 310. The bus master interface 302 may comprise suitable logic, circuitry, and/or code that may enable communication of control data, digital audio data, and/or RDS/RBDS data between the portions of the PTU 204 shown in FIG. 3 and the common bus 201. The bus master interface 302 may transfer digital audio data and/or RDS/RBDS data to the common bus 201. The RDS/RBDS data may be transferred to the memory 212, for example. In some instances, the RDS/RBDS data may be transferred to the memory 212 when the CPU 210 is in a stand-by or sleep mode. The bus master interface 302 may push RDS/RBDS data into a buffer in the memory 212 or may pull RDS/RBDS data from a buffer in the memory 212, for example. The digital audio data may be transferred to the CPU 210 for processing, for example. The CPU 210 may generate and/or receive control data that may be communicated with the PTU 204 and/or the FM core 208 via the common bus 201.

In one embodiment of the invention, the single chip with integrated FM and Bluetooth radios may implement a search algorithm that collects and stores data during scanning of the FM band. The single chip may determine whether there is music or speech in a detected channel. Moreover, the single chip may enable searching and finding 10 of the strongest stations, for example, and may rank them.

In another embodiment of the invention, the single chip with integrated FM and Bluetooth radios may implement a search algorithm where the searches may be done based on specific criteria such as type of station or type of music, for example. The single chip may characterize each of the stations found based on the search.

In another embodiment of the invention, the single chip with integrated FM and Bluetooth radios may enable turning OFF a voltage regulator to the FM radio when in BT-only mode or turning OFF voltage regulators to the Bluetooth radio and the FM radio when both Bluetooth and FM are not being used, for example. In another embodiment of the invention, the single chip with integrated FM and Bluetooth radios may enable extending the battery life in a handheld device by requiring that the single chip does not consume power until configured by the host. Moreover, there may not be a load on the system until the chip is powered down and/or the chip may not draw any current when powered down.

In another embodiment of the invention, the single chip with integrated FM and Bluetooth radios may enable a digital filter that may combine de-emphasis, bass, and/or treble. The digital filter may have a programmable audio bandwidth, for example. In another embodiment of the invention, the single chip with integrated FM and Bluetooth radios may enable a power amplifier dynamical bypass for Class 1 systems. In another embodiment of the invention, the single chip with integrated FM and Bluetooth radios may enable an antenna with an adjustable center frequency.

In another embodiment of the invention, the single chip with integrated FM and Bluetooth radios may enable Bluetooth coexistence with WLAN. In this regard, coexistence may be supported when radiation of energy is not greater than a certain threshold. In some cases, such threshold may be 90 dBm, for example. The coexistence may be implemented to minimize the amount of energy that flows from the Bluetooth radio to the WLAN radio, for example. In this regard, the single chip may utilize a guilty-by-association technique in order to identify WLAN interfering channels in the vicinity of a Bluetooth device. Because WLAN channels may deteriorate very rapidly in the presence of Bluetooth communication, the guilty-by-association technique may enable a fast determination or identification of which adaptive frequency hopping (AFH) channels to block in order to limit the effect of Bluetooth communication on WLAN channels. Channel measurement statistics may be collected in 'bins' of N MHz each where N=2,3,4, etc and condemn the entire bin as bad if any K of the channels in the bin was measured as bad. An example may be when K=1. Condemnation of the entire bin as bad, that is, guilty-by-association, may increase both the reliability as well as speed with a WLAN channels of contiguous 20-22 MHz that may be blocked out in the AFH channel map. The use of techniques that modify the AFH channel map need not be limited to instances when a Bluetooth radio and an FM radio are integrated into a single chip. Modification of the AFH channel map may be applied to instances when Bluetooth applications are in coexistent operation with WLAN applications.

The WLAN interfering channels may be detected by utilizing channel measurement statistics such as received signal strength indicator (RSSI) energy measurements and/or packet error rate (PER) measurements. PER measurements may include missing a packet due to synchronization errors, cyclic redundancy check (CRC) errors in decoding the header, and/or CRC errors in decoding the payload, for example. These measurements may be performed during the Bluetooth frame duration (1.25 ms) on the current Bluetooth channel or on channels different from the current Bluetooth channel.

In another embodiment of the invention, the single chip with integrated FM and Bluetooth radios may enable a low noise FM phase-locked loop (PLL) that may minimize the 32 KHz clock noise and/or the large phase noise that may occur. In this regard, the FM PLL may utilize a narrow loop bandwidth, for example.

In another embodiment of the invention, the single chip with integrated FM and Bluetooth radios may disable at least a portion of the analog circuitry in the FM radio and/or the Bluetooth radio when performing digital processing. Disabling analog circuitry provides a reduction in the amount of power consumed by the single chip.

In another embodiment of the invention, the single chip with integrated FM and Bluetooth radios may be enabled to support high definition (HD) radio systems. In HD radio systems, the broadcasters may utilize digital signals to transmit existing analog AM and FM signals. In this regard, the analog AM and FM signals may be transmitted simultaneously and the use of digital channels may result in higher quality audio and a more robust signal. In first generation HD radio systems, services such as Main Program Service or Station Reference Service may be provided. Other services that may be supported for HD radio in the single chip may be requests for audio presentation of news, weather, entertainment, and/or stocks, for example. Additional services may comprise navigational products or applications, such as traffic information, for example, time-shifted listening, mobile commerce and advertisement, Internet-based broadcasts, and/or reading services for the visually impaired.

In an exemplary embodiment of the invention, image channel detection in an FM receiver front-end may be significantly improved via flexible tuning by utilizing a programmable IF frequency. For example, when an FM channel is changed, a tuning algorithm may first be utilized to distinguish image frequency channels from "on frequency" channels, or desired channels. In this regard, the initial channel spacing used in the tuning process may be chosen such that the image frequency falls between the minimum channel spacing, for example. Furthermore, the image channel may show a frequency error due to the fact that the image frequency falls between the minimum channel spacing. The frequency error may then be used to distinguish image channels from on frequency channels. In another embodiment of the invention, a frequency error may also be measured by measuring a DC offset at the output of an FM demodulator, where the DC offset may be proportional to the frequency error.

Figure 4A:
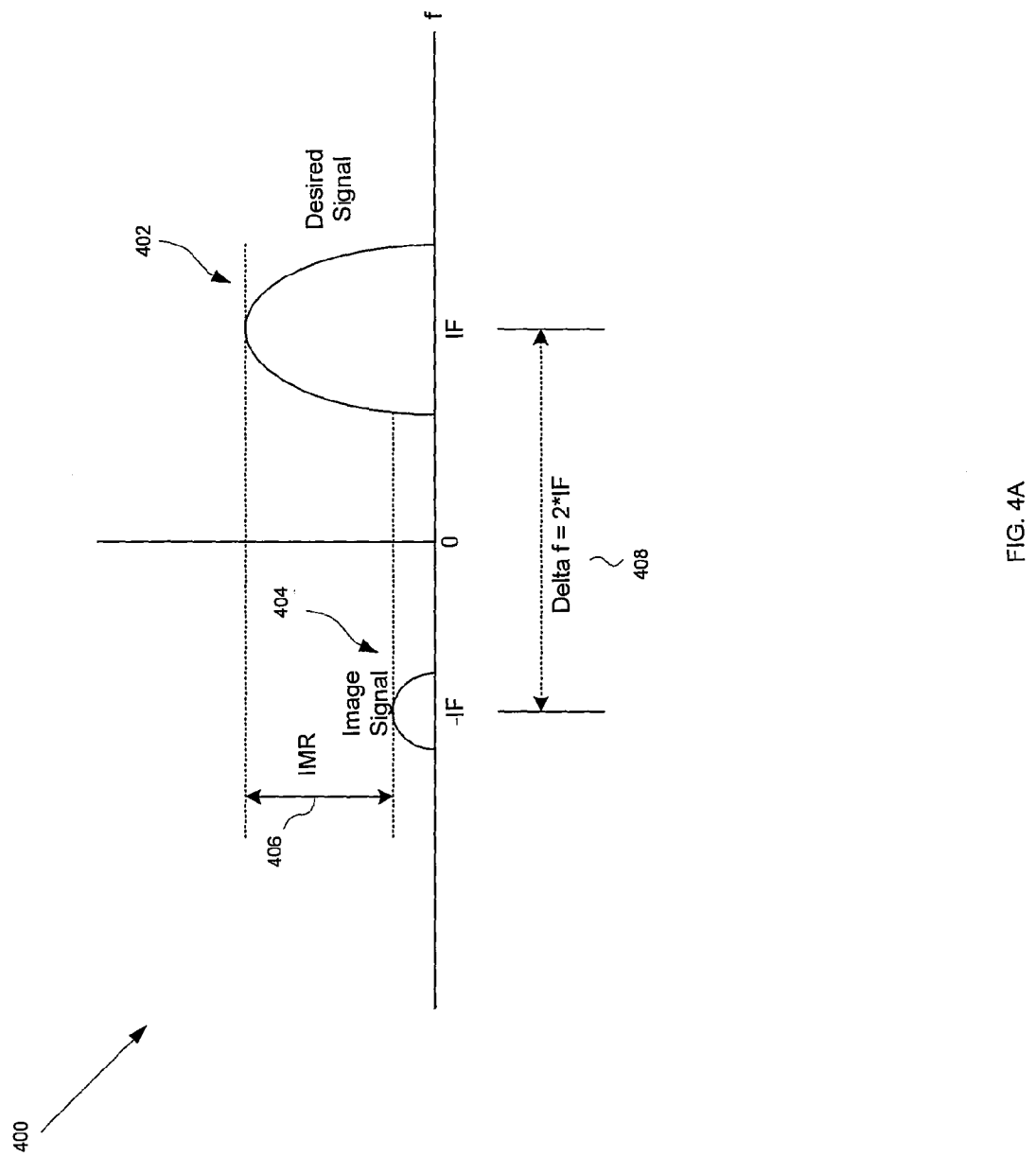
FIG. 4A is a graph illustrating an exemplary on frequency channel and a corresponding image channel, in accordance with an embodiment of the invention.

FIG. 4A is a graph illustrating an exemplary on frequency channel and a corresponding image channel, in accordance with an embodiment of the invention. Referring to FIG. 4A, the graph 400 illustrates the location of a desired frequency channel 402 and a corresponding image channel 404. The desired frequency channel 402 may be centered at the intermediate frequency (IF) and the corresponding image channel 404 may be centered at frequency (−IF). In instances where the image channel 404 is detected, it may be rejected utilizing image rejection (IMR) topologies, such as quadrature mixing followed by an image rejecting complex band-pass filtering. In this regard, the image channel 404 may be rejected by an IMR measure of 406. In an exemplary embodiment of the invention, a dynamically adjustable IF may be utilized to determine whether a particular frequency channel, such as channel 404, comprise an image channel. A frequency error may be detected in channel 404 and it may be determined that channel 404 comprises an image channel. In instances when a higher IF frequency is selected, the distance delta f 408, or Δf, may increase.

If delta f 408 increases, the image channel 404 may move away, or may shift to the left. Consequently, if the image channel 404 is detected and shifted by a determined offset, the image channel signal level 404 may be further suppressed by utilizing, for example, a complex image rejecting band pass filter. In another embodiment of the invention, after the image channel 404 is detected, high-side, low-side rejection may be utilized to flip the image channel 404 from one side to the other. In this regard, a high and low local oscillator frequency in conjunction with swapping the I and Q signals, may be utilized with the desired frequency channel 402 to flip the current image channel 404 on the other side of the desired signal 402. If the signal energy in the upper image frequency channel is lower in magnitude compared to the signal energy in the lower image channel, the upper image channel would be selected to achieve an improved signal-to-interferer ratio after the band-pass filtering.

Figure 4B:
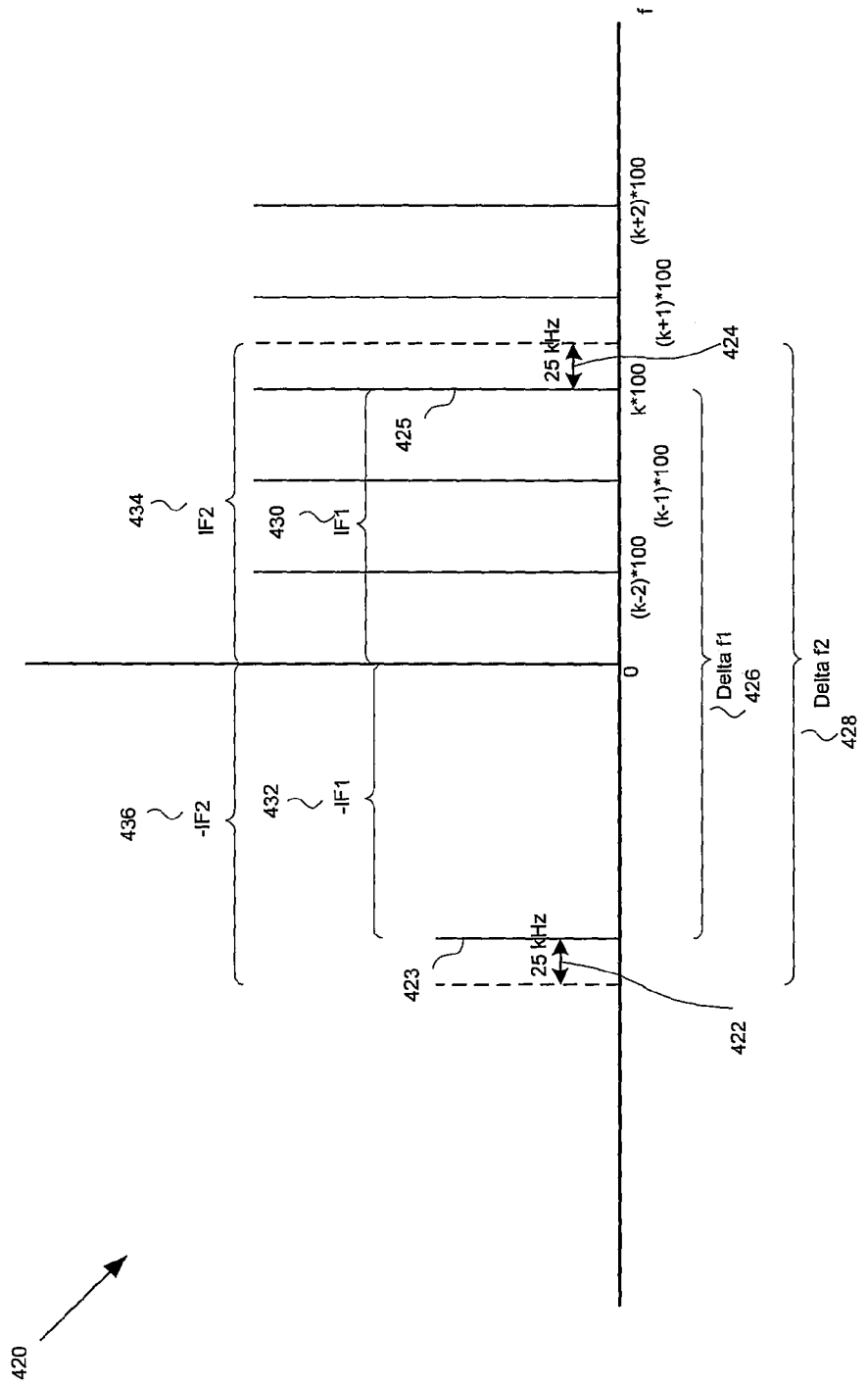
FIG. 4B is a graph illustrating selection of an intermediate frequency (IF) utilizing an offset, in accordance with an embodiment of the invention.

FIG. 4B is a graph illustrating selection of an intermediate frequency (IF) utilizing an offset, in accordance with an embodiment of the invention. Referring to FIG. 4B, the graph 420 illustrates channel spacing between a plurality of channels and selection of IF frequency for purposes of determining whether a particular frequency comprises an image channel. For example, channel spacing of N*100 kHz may be utilized for image channel detection, where N is an integer. Graph 420 illustrates channel spacing between neighboring channels (k−2)*100 kHz, (k−1)*100 kHz, k*100 kHz, (k+1)*100 kHz, and (k+2)*100 kHz, where k may be an integer. Frequency channel 425 may be located at k*100 kHz and a corresponding image channel 423 may be located at (−k)*100 kHz. The IF frequency for channel 425 may be IF1 430 and the corresponding IF frequency for the image channel 423 may be −IF1 432. Distance delta f1 426 may be 2*IF1.

In an exemplary embodiment of the invention, the IF frequency IF1 430 of channel 425 may be adjusted so that it includes an integer multiple of the channel spacing between FM channels in the vicinity of channel 425, offset by at most one-half the channel spacing. For example, the channel spacing of channels (k−2)*100 kHz, (k−1)*100 kHz, k*100 kHz, (k+1)*100 kHz, and (k+2)*100 kHz may be 100 kHz and the offset 424 for IF1 430 may be selected as one-quarter the channel spacing, or 25 kHz. As a result of the offset 424, the image channel 423 may be shifted by an offset 422, which is also 25 kHz. In this regard, delta f1 426, which is the distance between the on frequency channel 425 and the image channel 423, may be increased by 50 kHz. The resulting new delta f2 428 may be the sum of the new IF frequency IF2 434 of the offset channel 425 and the corresponding IF frequency (−IF2) 436 of the offset image channel 423.

The resulting delta f2 428 may be equal to K×100 kHz+50 kHz and the IF frequency IF2 434 may be equal to M×100 kHz+25 kHz. In this regard, a frequency error may be detected for channel 423 and it may be determined whether channel 423 is an image channel based on the determined frequency error of the received signal. If the frequency error is more than, for example, 25 kHz, then it may be determined that channel 423 comprises an image channel. If it is determined that channel 423 comprises an image channel, the delta f2 428 may be further changed so that the image channel 423 may be filtered, for example. Alternatively, the image channel 423 may be flipped by utilizing a high-side or low-side injection point.

Even though channel spacing of N*100 kHz is utilized for flexible tuning and image channel detection, the present invention may not be so limited. Other channel spacing may also be utilized so that an IF frequency may include an integer multiple of the channel spacing between neighboring allocated FM channels offset by at most one-half channel spacing. In another embodiment of the invention, flexible tuning may be used in performing a search up-band and/or down-band on an FM radio, for example. Tuning information may be obtained during the search and a history of frequency channels and corresponding image channels may be kept to help in search algorithms. In some instances, information on which channels are on-channels and which are image channels may be stored. In another embodiment of the invention, changing the IF frequency and delta f may be performed dynamically during tuning of FM channels.

Figure 4C:
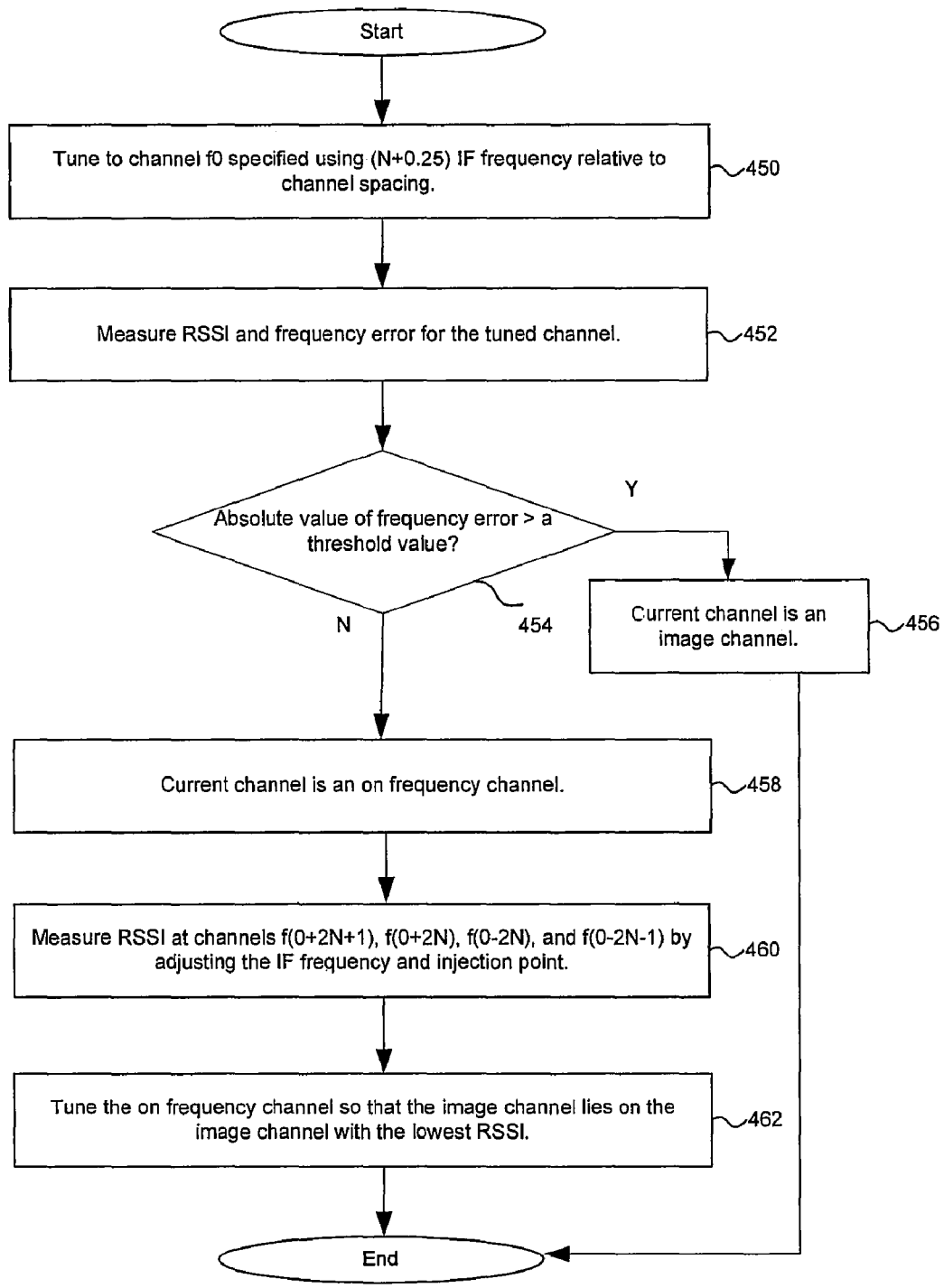
FIG. 4C is a flow diagram that illustrates exemplary steps for flexible FM tuning, in accordance with an embodiment of the invention.

FIG. 4C is a flow diagram that illustrates exemplary steps for flexible FM tuning, in accordance with an embodiment of the invention. Referring to FIG. 4C, at 450, an FM radio may be initially tuned to channel f0 specified using (N+0.25)*IF frequency relative to channels spacing, where N may be an integer. At 452, a received signal strength indicator (RSSI) and/or a frequency error may be measured for the tuned channel. At 454, it may be determined whether the absolute value of the frequency error is greater than a threshold value. If the absolute value of the frequency error is greater than the threshold value, at 456, it may be determined that the current channel is an image channel. If the absolute value of the frequency error is not greater than the threshold value, at 458, it may be determined that the current channel is an on frequency channel, or a desired channel. At 460, RSSI may be measured at channels f(0+2N+1), f(0+2N), f(0−2N), and f(0−2N−1) by adjusting the IF frequency and/or the injection point. At 462, the on frequency channel, or the desired channel may be tuned so that the image channel lies on the image channel with the lowest RSSI. In instances when a channel has RDS, program information (PI) code associated with the RDS may be utilized to determine country information. In this regard, an optimum image channel setting may be determined based on the country information within the PI code.

In another embodiment of the invention, an FM receiver, such as the FM receiver 222 in FIG. 2A, may be utilized for an UP or DOWN channel search with a modified flexible tuning search algorithm. Since the search performed by the FM receiver may be sequential, the first 4N+2 channels "on channel" RSSI may be gathered before making the decision on which frequency channel to select first. Moreover, an image frequency and injection point may then be determined for the channel scanned 2N+1 steps back with every new channel scanned. In this regard, an FM radio may enable scanning UP or DOWN in frequency from a presently tuned channel and stop on the next channel with RSSI above a threshold value, for example.

The search algorithm may be utilized for distinguishing image channels and also strong channels that may cross the RSSI threshold value but may be off in frequency. The selection of the IF frequency during the search may be such that an image channel may have a nominal frequency error of at most half the channel spacing, such as 50 kHz, for example. In this regard, the image channel may be distinguished from the desired on frequency channel. The search algorithm may also be utilized for determining whether high-side or low-side injection may provide better receive performance, and a signal quality metric may be developed for this purpose.

Figure 5:
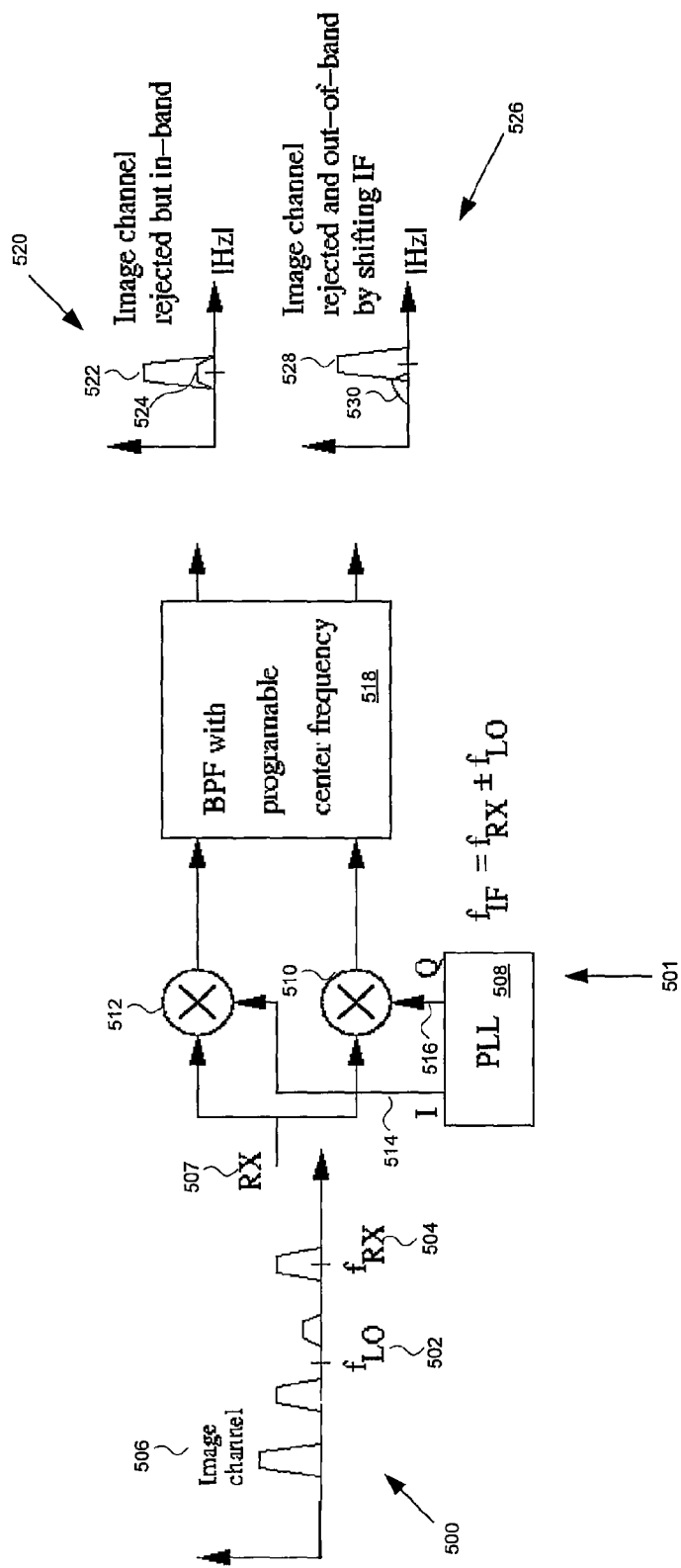
FIG. 5 is a block diagram illustrating an exemplary front-end portion of an FM radio receiver, in accordance with an embodiment of the invention.

FIG. 5 is a block diagram illustrating an exemplary front-end portion of an FM radio receiver, in accordance with an embodiment of the invention. Referring to FIG. 5, there is shown the frequency domain operation of a portion of an FM radio receiver front-end 501. In this regard, the operation refers to a variable receiver (RX) intermediate frequency (IF). The FM radio receiver front-end 501 may comprise a phase-locked-loop (PLL) 508, mixers 512 and 510, and a complex band-pass filter (BPF) 518. The BPF 518 may comprise a BPF with programmable center frequency.

The PLL 508 may comprise suitable circuitry, logic, and/or code and may be utilized as a local oscillator to generate an in-phase (I) component 514 and a quadrature (Q) component 516 of a local oscillator frequency $f_{LO}$. In addition, the PLL 508 may be adapted to provide fine resolution in output frequency. The mixers 512 and 510 may comprise suitable circuitry, logic, and/or code and may be adapted to mix a received signal $f_{RX}$ with a local oscillator signal $f_{LO}$ to generate an IF signal $f_{IF}$. In this regard, the generated IF signal $f_{IF}$ may be expressed with the equation $f_{IF}=\pm f_{RX}\pm f_{LO}$, where $(f_{RX}-f_{LO})$ may be the desired signal and $(-f_{RX}+f_{LO})$ may be the unwanted image signal. Graph 500 illustrates the location on the frequency spectrum of the desired signal $f_{RX}$ 504, the local oscillator signal $f_{LO}$ 502 and the image channel 506 corresponding to the desired signal 504.

In operation, the received signal $R_X$ 507 may be communicated to the mixers 512 and 510. The PLL 508 may communicate the I component 514 to the mixer 512 and the Q component 516 to the mixer 510 for mixing with the received channel $f_{RX}$ 507 to generate an IF signal $f_{IF}$. The generated IF signal may be filtered by the complex BPF 518 to pass through the desired signal and filter out interference signals, such as adjacent and image channels. The BPF 518 with programmable center frequency may provide flexibility to avoid image interferers and/or may give a performance advantage in RF environments with unequal channel separation. The center frequency may be programmable from 300 kHz to 375 kHz in 25 kHz steps, for example. After down conversion, the image frequency may be 600 kHz, 650 kHz, 700 kHz or 750 kHz, for example, away from the desired signal, for example.

For example, graph 520 illustrates the desired signal 522 and the corresponding image channel 524 after down conversion by the receiver front-end 501. The image channel 524 may be rejected by utilizing the BPF 518, however, the image channel 524 may be in-band with the desired signal 522. In one embodiment of the invention, flexible tuning may be utilized with programmable IF frequency so that the image channel interference signal after down-conversion and image rejection 506 may be shifted out-of-band, detected and rejected. For example, the image channel 506 may be shifted by shifting the IF frequency prior to down-conversion utilizing an offset by at most one-half the channel spacing. After down-conversion, the image channel 530 may be shifted out-of-band and away from the desired signal 528, as illustrated by graph 526. The out-of-band image channel 530 may be rejected a certain amount by the image-rejecting complex BPF 518 with a programmable center frequency.

Figure 6:
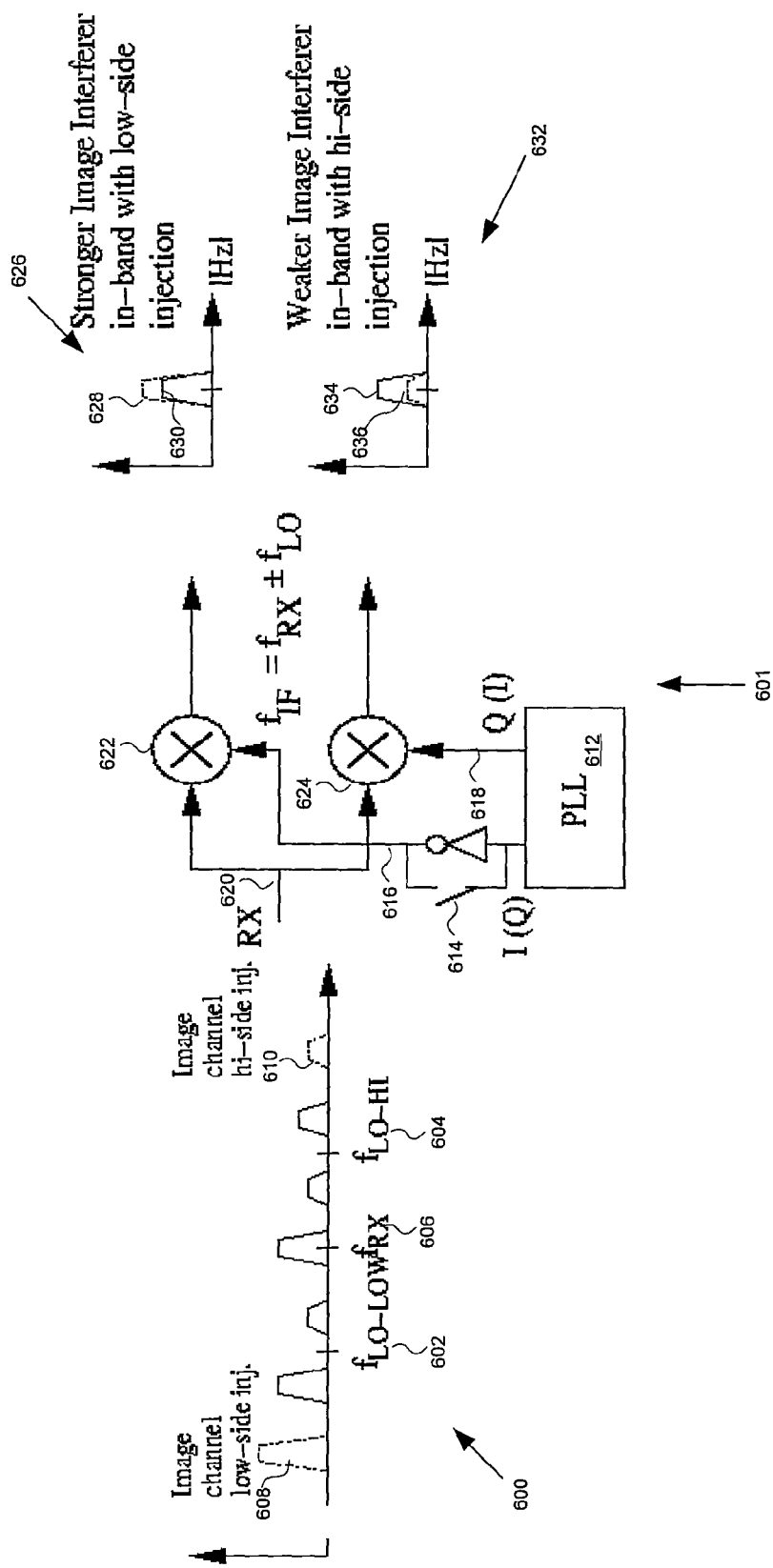
FIG. 6 is a block diagram illustrating an exemplary high-side and low-side injection in a front-end portion of an FM radio receiver, in accordance with an embodiment of the invention.

FIG. 6 is a block diagram illustrating an exemplary high-side and low-side injection in a front-end portion of an FM radio receiver, in accordance with an embodiment of the invention. The FM radio receiver front-end 601 may comprise a phase-locked-loop (PLL) 612, mixers 622 and 624, and a switch 614. The PLL 612 may comprise suitable circuitry, logic, and/or code and may be utilized as a local oscillator (LO) to generate an in-phase (I) component 616 and a quadrature (Q) component 618 of a local oscillator frequency $f_{LO}$. The PLL 612 may also be adapted to use high-side and low-side injection by flipping the LO-I 616 and LO-Q 618 signal definitions via the switch 614, thereby swapping the relative phase difference between LO-I 616 and LO-Q 618. The mixers 622 and 624 may comprise suitable circuitry, logic, and/or code and may be adapted to mix a received signal $f_{RX}$ with a local oscillator signal $f_{LO}$ to translate the RX signal to an IF signal $f_{IF}$. In this regard, the generated IF frequency $f_{IF}$ may be expressed with the equation $f_{IF}=\pm f_{RX} \pm f_{LO}$, where $(f_{RX}-f_{LO})$ may be the desired signal and $(-f_{RX}+f_{LO})$ may be the unwanted image signal. The FM radio receiver front-end 601 may avoid strong image interferers by switching from high to low side injection when the LO-I 616 and LO-Q 618 signal definitions are swapped by the PLL 612. High side injection may be represented by $f_{LO}=f_{RF}+f_{IF}$, and low side injection may be represented by $f_{LO}=f_{RF}-f_{IF}$. In some instances, variable IF and Hi-Lo side injection may be considered. For example, the combination of variable IF and programmable Hi-Lo side injection point may reduce the signal level of the image interferer in a desired signal band. In this regard, the quality of the received signal 620 may be enhanced.

Graph 600 illustrates the location on the frequency spectrum of the desired signal $f_{RX}$ 606, a low local oscillator signal $f_{LO-LOW}$ 602, a high oscillator signal $f_{LO-HI}$ 604, and the image channels 608 and 610 corresponding to the desired signal 606 when $f_{LO-LOW}$ 602 and $f_{LO-HI}$ 604, respectively, are generated by the PLL 612.

In operation, the received signal $R_X$ 620 may be communicated to the mixers 622 and 624. The PLL 612 may communicate the I component 616 to the mixer 622 and the Q component 618 to the mixer 624 for mixing with the received channel $f_{RX}$ 620 to generate an IF signal $f_{IF}$. Graph 626 illustrates the absolute frequency location of the desired signal 630 and the in-band interferer signal 628 with low-side injection when $f_{LO-LOW}$ 602 is utilized for generation of the IF frequency. Similarly, graph 632 illustrates the absolute frequency location of the desired signal 634 and the in-band interferer signal 636 with hi-side injection when $f_{LO-HI}$ 604 is utilized for generation of the IF frequency. In this regard, since interference signal 610 is weaker than interference signal 608, hi-side injection may be selected for reducing interference signal after down-conversion. This may be achieved by, for example, flexible FM tuning.

Figure 7:
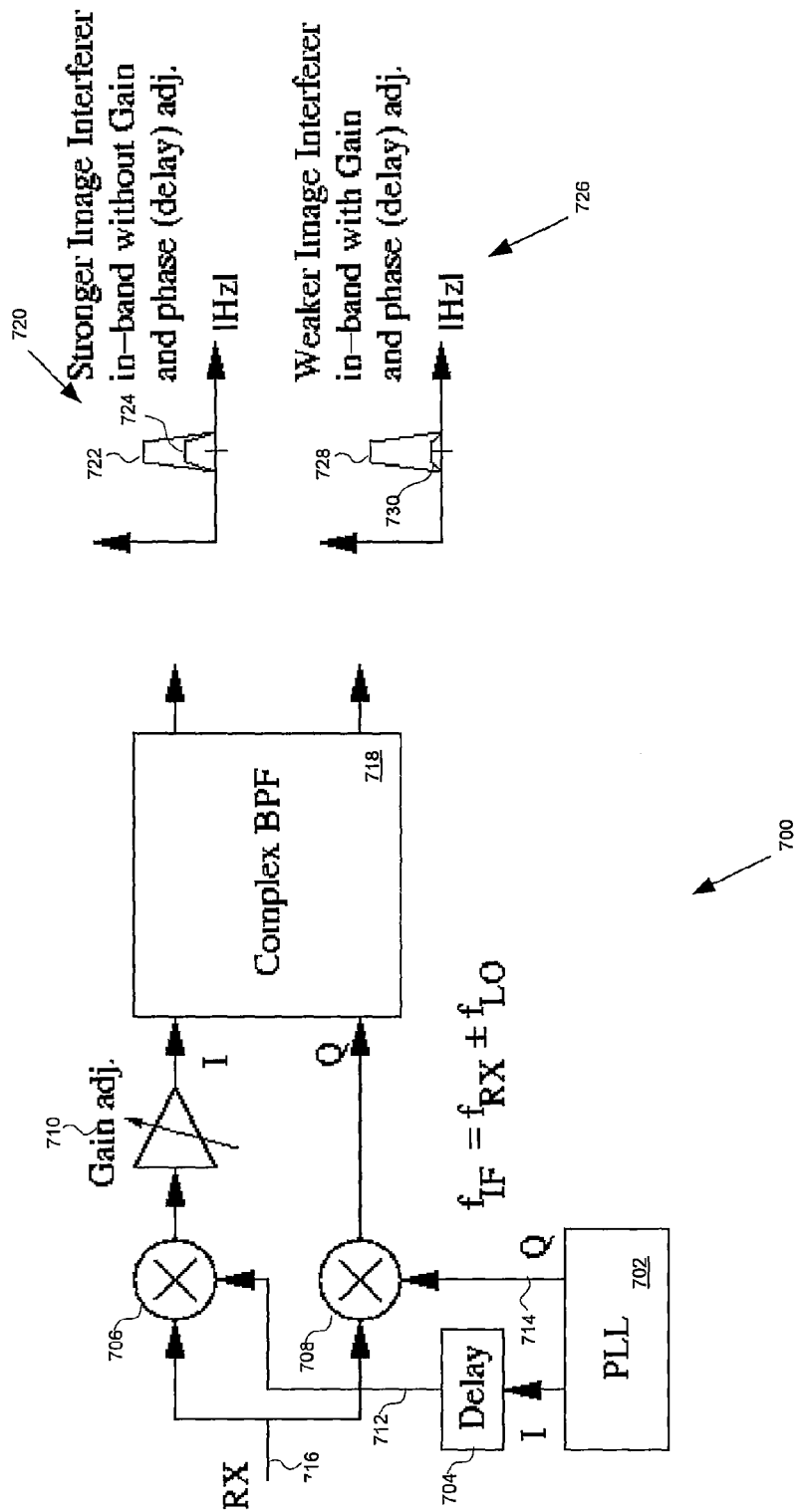
FIG. 7 is a block diagram illustrating I/Q phase and amplitude adjustment in a front-end portion of an FM radio receiver, in accordance with an embodiment of the invention.

FIG. 7 is a block diagram illustrating I/Q phase and amplitude adjustment in a front-end portion of an FM radio receiver, in accordance with an embodiment of the invention. Referring to FIG. 7, the FM radio receiver front-end 700 may comprise a phase-locked-loop (PLL) 702, mixers 706 and 708, a complex band-pass filter (BPF) 718, a delay block 704, and gain adjustment block 710.

The PLL 702 may comprise suitable circuitry, logic, and/or code and may be utilized as a local oscillator to generate an in-phase (I) component 712 and a quadrature (Q) component 714 of a local oscillator frequency $f_{LO}$. The mixers 706 and 708 may comprise suitable circuitry, logic, and/or code and may be adapted to mix a received signal $f_{RX}$ 716 with a local oscillator signal $f_{LO}$ to generate an IF signal $f_{IF}$. In this regard, the RX signal may be translated to frequencies expressed with the equation $f_{IF}=f_{RX}\pm f_{LO}$, where $(f_{RX}-f_{LO})$ may be the desired signal and $(-f_{RX}+f_{LO})$ may be the unwanted image signal. Due to mismatches, offsets, and/or design asymmetry within the receiver front-end 700, the I/Q LO signal may have amplitude and/or phase errors. In these instances, the amount of image rejection achievable may be determined by the I/Q non-idealities and the characteristics of the complex filter, for example. For example, referring to graph 720, a strong image interferer signal 724 may be in-band with a desired signal 722. The negative impact of the I/Q LO non-idealities may be corrected by adjusting the relative phase difference between the LO I- and Q-signals 712 and 714 utilizing the delay block 704, and the relative amplitude difference between the IF I- and Q-signals utilizing the gain adjustment block 710. Referring to graph 726, the image interferer signal 730 is still in-band with the desired signal 728. However, the image interferer signal 730 has weakened compared to the interferer signal 724, due to the gain and phase adjustment within the receiver front-end 700.

Figure 8:
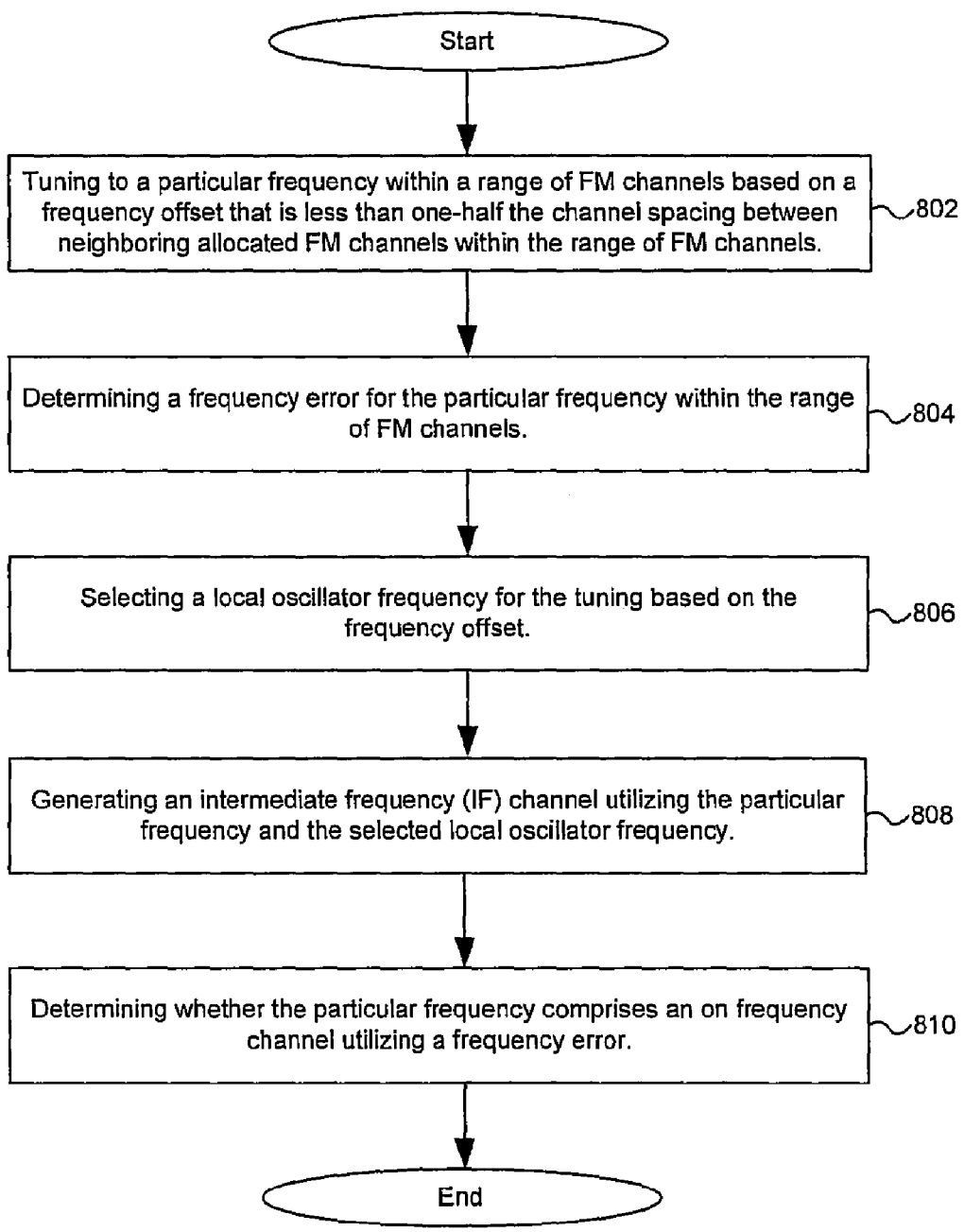
FIG. 8 is a flow diagram that illustrates exemplary steps for processing of signals, in accordance with an embodiment of the invention.

FIG. 8 is a flow diagram that illustrates exemplary steps for processing of signals, in accordance with an embodiment of the invention. Referring to FIGS. 2A and 8, at 802, the FM receiver 222 may tune to a particular frequency within a range of FM channels based on a frequency offset that is less than one-half the channel spacing between neighboring allocated FM channels within the range of FM channels. At 804, a frequency error may be determined by the FM receiver 222 for the particular frequency within the range of FM channels. At 806, the FM receiver 222 may select a local oscillator frequency for the tuning based on the frequency offset. At 808, the FM receiver 222 may generate an intermediate frequency (IF) channel utilizing the particular frequency and the selected local oscillator frequency. The generated IF channel may be between neighboring channels selected from the range of FM channels. At 810, it may be determined whether the particular frequency comprises an on frequency channel utilizing a frequency error. The frequency error may be based on the frequency offset.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
    performing by one or more processors and/or circuits integrated within a single chip, functions comprising:
        selecting from a range of FM channels, a particular frequency for one of said FM channels based on an intermediate frequency (IF), wherein said particular frequency is selected so that it is an integer multiple of a channel spacing between neighboring allocated FM channels within said range of FM channels, and is offset by at most one-half said channel spacing;

determining a frequency error of said selected particular frequency for said one of said FM channels; and determining whether said particular frequency comprises an on-frequency channel based on said determined frequency error.

2. The method according to claim 1, further comprising receiving a local oscillator frequency to enable tuning to said particular frequency for one of said FM channels.

3. The method according to claim 2, wherein said received local oscillator frequency is based on said intermediate frequency.

4. The method according to claim 2, further comprising generating an intermediate frequency channel utilizing said particular frequency and said selected local oscillator frequency, wherein said generated intermediate frequency channel is between neighboring channels selected from said range of FM channels.

5. The method according to claim 1, further comprising determining said frequency error for said particular frequency within said range of FM channels based on said intermediate frequency.

6. The method according to claim 1, further comprising determining whether said particular frequency comprises an image channel based on said frequency error.

7. The method according to claim 1, further comprising, if said particular frequency comprises said on-frequency channel, determining signal strength for each of a plurality of FM channels adjacent to said particular frequency.

8. The method according to claim 7, further comprising selecting an FM channel from said plurality of FM channels adjacent to said particular frequency, based on said determined signal strength for each of said plurality of FM channels.

9. The method according to claim 8, further comprising tuning an image channel corresponding to said particular frequency to said selected FM channel.

10. The method according to claim 1, further comprising determining said frequency error for said particular frequency utilizing a DC offset.

11. The method according to claim 10, further comprising determining said DC offset at an output of a demodulator utilized for demodulating said range of FM channels.

12. The method according to claim 1, further comprising tuning to at least one of said plurality of on frequency channels based on a corresponding history of said frequency channels.

13. The method according to claim 1, further comprising storing signal strength information for a plurality of image channels corresponding to a plurality of on-frequency channels selected from said range of FM channels.

14. The method according to claim 13, further comprising tuning to at least one of said plurality of on-frequency channels based on said stored signal strength information.

15. A machine-readable storage having stored thereon, a computer program having at least one code section for processing signals, the at least one code section being executable by a machine for causing the machine to perform steps comprising:

selecting from a range of FM channels, a particular frequency for one of said FM channels based on an intermediate frequency (IF), wherein said particular frequency is selected so that it is an integer multiple of a channel spacing between neighboring allocated FM channels within said range of FM channels, and is offset by at most one-half said channel spacing;

determining a frequency error of said selected particular frequency for said one of said FM channels; and determining whether said particular frequency comprises an on-frequency channel based on said determined frequency error.

16. The machine-readable storage according to claim 15, comprising code for receiving a local oscillator frequency to enable tuning to said particular frequency for one of said FM channels.

17. The machine-readable storage according to claim 16, wherein said received local oscillator frequency is based on said intermediate frequency.

18. The machine-readable storage according to claim 16, comprising code for generating an intermediate frequency channel utilizing said particular frequency and said selected local oscillator frequency, wherein said generated intermediate frequency channel is between neighboring channels selected from said range of FM channels.

19. The machine-readable storage according to claim 15, comprising code for determining said frequency error for said particular frequency within said range of FM channels based on said intermediate frequency.

20. The machine-readable storage according to claim 15, comprising code for determining whether said particular frequency comprises an image channel based on said frequency error.

21. The machine-readable storage according to claim 15, comprising code for, if said particular frequency comprises said on-frequency channel, determining signal strength for each of a plurality of FM channels adjacent to said particular frequency.

22. The machine-readable storage according to claim 21, comprising code for selecting an FM channel from said plurality of FM channels adjacent to said particular frequency, based on said determined signal strength for each of said plurality of FM channels.

23. The machine-readable storage according to claim 22, comprising code for tuning an image channel corresponding to said particular frequency to said selected FM channel.

24. The machine-readable storage according to claim 15, comprising code for determining said frequency error for said particular frequency utilizing a DC offset.

25. The machine-readable storage according to claim 24, comprising code for determining said DC offset at an output of a demodulator utilized for demodulating said range of FM channels.

26. The machine-readable storage according to claim 15, comprising code for tuning to at least one of said plurality of on frequency channels based on a corresponding history of said frequency channels.

27. The machine-readable storage according to claim 15, comprising code for storing signal strength information for a plurality of image channels corresponding to a plurality of on-frequency channels selected from said range of FM channels.

28. The machine-readable storage according to claim 27, comprising code for tuning to at least one of said plurality of on-frequency channels based on said stored signal strength information.

29. A system for processing signals, the system comprising:

a single chip having an integrated Bluetooth radio and an integrated FM radio comprising:

at least one processor that enables selecting from a range of FM channels, a particular frequency for one of said FM channels based on an intermediate frequency (IF), wherein said particular frequency is selected so that it is an integer multiple of a channel spacing between neighboring allocated FM channels within said range of FM channels, and is offset by at most one-half said channel spacing;

said at least one processor enables determining a frequency error of said selected particular frequency for said one of said FM channels; and said at least one processor enables determining whether said particular frequency comprises an on-frequency channel based on said determined frequency error.

30. The system according to claim 29, wherein said at least one processor enables receiving a local oscillator frequency to enable tuning to said particular frequency for one of said FM channels.

31. The system according to claim 30, wherein said received local oscillator frequency is based on said intermediate frequency.

32. The system according to claim 30, wherein said at least one processor enables generating an intermediate frequency channel utilizing said particular frequency and said selected local oscillator frequency, wherein said generated intermediate frequency channel is between neighboring channels selected from said range of FM channels.

33. The system according to claim 29, wherein said at least one processor enables determining said frequency error for said particular frequency within said range of FM channels based on said intermediate frequency.

34. The system according to claim 29, wherein said at least one processor enables determining whether said particular frequency comprises an image channel based on said frequency error.

35. The system according to claim 29, wherein said at least one processor enables determining signal strength for each of a plurality of FM channels adjacent to said particular frequency, if said particular frequency comprises said on-frequency channel.

36. The system according to claim 35, wherein said at least one processor enables selecting an FM channel from said plurality of FM channels adjacent to said particular frequency, based on said determined signal strength for each of said plurality of FM channels.

37. The system according to claim 36, wherein said at least one processor enables tuning an image channel corresponding to said particular frequency to said selected FM channel.

38. The system according to claim 29, wherein said at least one processor enables determining said frequency error for said particular frequency utilizing a DC offset.

39. The system according to claim 38, wherein said at least one processor enables determining said DC offset at an output of a demodulator utilized for demodulating said range of FM channels.

40. The system according to claim 29, wherein said at least one processor enables tuning to at least one of said plurality of on frequency channels based on a corresponding history of said frequency channels.

41. The system according to claim 29, wherein said at least one processor enables storing signal strength information for a plurality of image channels corresponding to a plurality of on-frequency channels selected from said range of FM channels.

42. The system according to claim 41, wherein said at least one processor enables tuning to at least one of said plurality of on-frequency channels based on said stored signal strength information.

* * * * *